US009817933B2

(12) United States Patent
Wang et al.

(10) Patent No.: US 9,817,933 B2
(45) Date of Patent: Nov. 14, 2017

(54) SYSTEMS AND METHODS FOR SWITCHING USING HIERARCHICAL NETWORKS

(71) Applicant: The Regents of the University of California, Oakland, CA (US)

(72) Inventors: Chengcheng Wang, San Jose, CA (US); Dejan Markovic, Palo Alto, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/777,477

(22) PCT Filed: Mar. 14, 2014

(86) PCT No.: PCT/US2014/029407
§ 371 (c)(1),
(2) Date: Sep. 15, 2015

(87) PCT Pub. No.: WO2014/144832
PCT Pub. Date: Sep. 18, 2014

(65) Prior Publication Data
US 2016/0034625 A1 Feb. 4, 2016

Related U.S. Application Data

(60) Provisional application No. 61/786,676, filed on Mar. 15, 2013.

(51) Int. Cl.
*G06F 17/50* (2006.01)
*H03K 19/177* (2006.01)
(Continued)

(52) U.S. Cl.
CPC ........ *G06F 17/5054* (2013.01); *G06F 17/509* (2013.01); *G06F 17/5072* (2013.01);
(Continued)

(58) Field of Classification Search
CPC ............. G06F 13/4022; G06F 15/7867; G06F 17/509; G06F 19/3481; G06F 2009/45595;
(Continued)

(56) References Cited

U.S. PATENT DOCUMENTS 6,185,220 B1 2/2001 Muthukrishnan et al.
6,307,852 B1 10/2001 Fisher et al.
(Continued)

FOREIGN PATENT DOCUMENTS

JP 09307428 A 11/1997
WO 9933177 7/1999
(Continued)

OTHER PUBLICATIONS

Partial European Search Report for European Application No. 14765825.6, Search dated Sep. 27, 2016, dated Oct. 17, 2016, 9 Pgs.
(Continued)

*Primary Examiner* — Helen Rossoshek
(74) *Attorney, Agent, or Firm* — KPPB LLP

(57) ABSTRACT

Systems and methods for implementing boundary-less hierarchical networks including methods of generating such networks in accordance with embodiments of the invention are disclosed. In one embodiment, a hierarchical network in an integrated circuit that includes a plurality of computing elements, where the plurality of computing elements have M outputs and N inputs, and a plurality of switches arranged into stages of switches wherein the plurality of computing elements are connected to switches in a first stage, the switches in the first stage are connected to the plurality of computing elements and switches in a second stage, where the switches in the second stage are connected to the switches in the first stage, at least M+1 adjacent computing elements can connect to at least two nearest neighboring
(Continued)

computing elements via a stage 1 switch, and every computing element can connect with every other computing element within the hierarchical network.

21 Claims, 39 Drawing Sheets

(51) Int. Cl.
*G06F 13/40* (2006.01)
*G06F 15/78* (2006.01)

(52) U.S. Cl.
CPC . *H03K 19/17728* (2013.01); *H03K 19/17744* (2013.01); *G06F 13/4022* (2013.01); *G06F 15/7867* (2013.01)

(58) Field of Classification Search
CPC ............ G06F 17/5054; G06F 17/5072; H03K 19/17728
See application file for complete search history.

(56) References Cited

U.S. PATENT DOCUMENTS

| | | | |
|---|---|---|---|
| 6,868,084 B2 | 3/2005 | Konda et al. | |
| 6,885,669 B2 | 4/2005 | Konda et al. | |
| 7,216,326 B2* | 5/2007 | Papanikolaou | G06F 17/5045 716/120 |
| 7,233,167 B1* | 6/2007 | Kaptanoglu | H03K 19/17728 326/38 |
| 7,378,938 B2 | 5/2008 | Konda et al. | |
| 7,424,010 B2 | 9/2008 | Konda et al. | |
| 7,424,011 B2 | 9/2008 | Konda et al. | |
| 7,924,052 B1 | 4/2011 | Feng et al. | |
| 8,098,081 B1 | 1/2012 | Trimberger et al. | |
| 8,170,040 B2 | 5/2012 | Konda et al. | |
| 8,269,523 B2 | 9/2012 | Konda et al. | |
| 8,270,400 B2 | 9/2012 | Konda et al. | |
| 8,363,649 B2 | 1/2013 | Konda et al. | |
| 8,665,727 B1* | 3/2014 | Trimberger | G06F 17/5072 370/238 |
| 8,830,873 B2* | 9/2014 | Tomic | H04L 12/462 370/255 |
| 8,898,611 B2 | 11/2014 | Konda | |
| 9,077,338 B1* | 7/2015 | Schulz | H03K 19/1735 |
| 9,432,298 B1* | 8/2016 | Smith | H04L 49/9057 |
| 9,503,092 B2* | 11/2016 | Guilloy | H03K 19/1735 |
| 2002/0113619 A1 | 8/2002 | Wong | |
| 2004/0032866 A1 | 2/2004 | Konda et al. | |
| 2004/0056757 A1 | 3/2004 | Konda et al. | |
| 2004/0150422 A1 | 8/2004 | Wong et al. | |
| 2005/0053061 A1 | 3/2005 | Konda et al. | |
| 2005/0063410 A1 | 3/2005 | Konda et al. | |
| 2005/0117573 A1 | 6/2005 | Konda et al. | |
| 2006/0114023 A1 | 6/2006 | Ting et al. | |
| 2006/0159078 A1 | 7/2006 | Konda et al. | |
| 2006/0165085 A1 | 7/2006 | Konda et al. | |
| 2006/0268691 A1 | 11/2006 | Ramanan et al. | |
| 2007/0124565 A1 | 5/2007 | Jones et al. | |
| 2009/0289661 A1 | 11/2009 | Lee et al. | |
| 2012/0284379 A1* | 11/2012 | Zievers | G06F 15/781 709/222 |
| 2014/0313930 A1 | 10/2014 | Konda et al. | |
| 2015/0004976 A1 | 1/2015 | Ookubo | |
| 2015/0046895 A1 | 2/2015 | Konda | |
| 2015/0049768 A1 | 2/2015 | Konda | |
| 2015/0341037 A1* | 11/2015 | Schulz | H03K 19/1735 326/41 |
| 2016/0036428 A1* | 2/2016 | Wang | H03K 19/17772 327/437 |
| 2016/0261525 A1* | 9/2016 | Konda | H04L 49/109 |
| 2017/0054445 A1* | 2/2017 | Wang | H03K 19/1735 |
| 2017/0093404 A1* | 3/2017 | Wang | H03K 19/1735 |

FOREIGN PATENT DOCUMENTS

| | | |
|---|---|---|
| WO | 2006/033650 A1 † | 3/2006 |
| WO | 2008/147926 A1 † | 12/2008 |
| WO | 2008/147928 A1 † | 12/2008 |
| WO | 2011/047368 A2 † | 4/2011 |
| WO | 2013/036544 A1 † | 3/2013 |
| WO | 2014144830 A1 | 9/2014 |
| WO | 2014144832 A1 | 9/2014 |

OTHER PUBLICATIONS

International Preliminary Report on Patentability for International Application PCT/US2014/029407, Report dated Sep. 15, 2015, dated Sep. 24, 2015, 6 Pgs.
International Search Report and Written Opinion for International Application PCT/US2014/029407, report dated Aug. 25, 2014, dated Aug. 25, 2014, 9 Pgs.
Extended European Search Report for European Application No. 14765825.6, Search dated Sep. 27, 2016, dated Jan. 18, 2017, 13 Pg.
Amendment and Reply of May 31, 2016 to Office Action dated May 11, 2016 to U.S. Appl. No. 15/041,085; pp. 17; First Named Inventor Cheng C. Wang.†
C. Clos, A Study of Non-Blocking Switching Networks, Bell System Technical Journal, 32:406-424, 1953.†
V.E. Benes, Mathematical Theory of Connecting Networks and Telephone Traffic, Aademic Press, 1965.†
Chihming Chang, Rami Melhem, Arbitrary Size Benes Networks, Journal: Parallel Processing Letters—PPL, vol. 7, No. 3, pp. 279-284, 1997.†
Hoda El-Sayed and Abdou Youssef, The r-truncated Benes Networks and their Randomized Routing Algorithms, pp. 76-80, 1997 International Conference on Parallel and Distributed Systems, Seoul, Korea, Dec. 1997.†
Guy Lemieux and David Lewis, Using Sparse Crossbars within LUT Clusters, Proceedings of the ACM/SIGDA International Symposium on Field Programmable Gate Arrays 2001, Feb. 11?13, 2001, Monterey, CA.†

\* cited by examiner
† cited by third party

SYSTEMS AND METHODS FOR SWITCHING USING HIERARCHICAL NETWORKS

CROSS-REFERENCE TO RELATED APPLICATIONS

This application is a national stage application under 35 U.S.C. §371 of International Application No. PCT/US2014/029407, titled "Network Architectures for Boundary-less Hierarchical Interconnects," filed on Mar. 14, 2014, which claims priority to U.S. Provisional Patent Application No. 61/786,676, titled "Radix-3 Network Architecture for Boundary-less Hierarchical Interconnects," filed Mar. 15, 2013, the contents of which are incorporated herein by reference.

GOVERNMENT LICENSE RIGHTS

[0000.2] This invention was made with Government support under N66001-09-1-2029, awarded by the U.S. Navy, Space and Naval Warfare Systems Command. The Government has certain rights in this invention.

FIELD OF THE INVENTION

The present inventions are directed to circuitry of and techniques for generating switch networks or architectures for logic and/or computing circuitry including (but not limited to) processors, state machines, gate arrays, programmable gate arrays, field programmable gate arrays (FPGAs), and system-on-chips (SOCs). For example, the present invention may be employed in a FPGA circuitry and more specifically to systems and methods for generating a boundary-less radix network. While the inventions and/or embodiments are described below in the context of FPGA circuitry, such discussion, inventions and/or embodiments are also applicable to logic and/or computing circuitry including (but not limited to) processors, state machines, and gate arrays, programmable gate arrays and SOCs. For the sake of brevity, a separate discussion for each and every logic and/or computing circuit is not provided with respect to each aspect of the disclosed inventions; however the applicability should be clear to one of ordinary skill in the art based on the instant disclosure.

BACKGROUND OF THE INVENTION

A FPGA is an integrated circuit designed to be configured by a customer or a designer after being manufactured. The FPGA configuration is generally specified using a hardware description language (HDL). Contemporary FPGAs have large resources of logic gates and random access memory (RAM) blocks to implement complex digital computations. FPGAs typically contain programmable logic components called "configurable logic blocks" (CLB) or "logic array blocks" (LAB), and a hierarchy of reconfigurable interconnects that allow the blocks to communicate with each other. Logic blocks can be configured to perform complex combinational functions, or merely simple logic gates like AND and XOR. In most FPGAs, the logic blocks also include memory elements, which may be simple flip-flops or more complete blocks of memory.

An application circuit can be mapped into a FPGA provided that adequate resources are available. While the number of CLBs/LABs and I/Os required can be easily determined from the design, the number of routing tracks needed may vary considerably even among designs with the same amount of logic. For example, a crossbar switch typically requires much more routing than a systolic array with the same gate count. Since unused routing tracks (i.e. wires) increase the cost (and decrease the performance) of the part without providing any benefit, FPGA manufacturers try to provide just enough tracks so that most designs that will fit in terms of Lookup tables (LUTs) and IOs can be routed. This is determined by estimates such as those derived from Rent's rule or by experiments with existing designs.

Generally, in hierarchical networks, information can be transmitted and/or received between various elements (e.g. CEs, switches, etc.) that are directly connected in an iterative manner. Typically, modern hierarchical networks can be based on a Benes network that includes Y computing elements (CEs) that communicate with each other by 2*log(Y) stages of 2×2 switches. Benes networks are rearrangable and non-blocking providing congestion free communication between CEs. A fat-tree network can reduce the number of stages from 2*log(Y) to log(Y) by allowing communications to flow forward and backward at each stage.

A Benes network including 8 CEs with 5 stages of 2×2 switches is illustrated in FIG. 1A. The network 100 includes eight CEs 102 each having 2 inputs 110 and 2 outputs 104. Multiple CEs can be abstracted into a single CE by adding more input and output wires. For example, CE 7 and CE 8 can be combined to form a block 112 with 4 outputs. Similarly, CE 7 and CE 8 can be combined to form a block 114 with 4 inputs. Following this abstraction, any single-route Benes network can be transformed into a double-route Benes network, as shown in FIG. 1B. In the network 150, the number of switches per stage can be reduced by half compared to network 100, by using double-route switches instead of single-route switches. For example, the switches 116 and 118 illustrated in FIG. 1A are both single-route switches having 2 inputs and 2 outputs. However, the abstracted switch 152 in FIG. 1B is a double-route switch having 4 inputs (2 pairs) and 4 outputs (2 pairs). Although constructed differently, the functionality of network 100 and network 150 are identical. Since 4-input CEs are more commonly applied to FPGAs, the rest of this description is illustrated using 4-input CEs with double-route switches, but it should be clear to one of ordinary skill in the art that this description can apply to a variety of CEs with arbitrary number of inputs and outputs and various switches with arbitrary number of stages and input and output routes by using similar abstraction techniques as discussed above. As an example, a Benes network that includes 8 CEs with 5 stages art is illustrated in FIG. 1C. The network 180, includes 8 CEs with 5 stages with each CEs' having 4-input, 4-output utilizing double-route switches.

A fat-tree network comprising of 8 CEs with 3 states of 2×2 switches is illustrated in FIG. 2. The network 200 includes 2×2 switches 202 having 4 bi-directional wires on both sides of the switch. Although drawn with 4 bi-directional wires 204 on both sides of the switch, the same can be implemented as 8 uni-directional wires 206 (4-input, 4-output) on each side of the switch.

A radix-2 fat-tree network of 16 CEs with 4 stages of 2×2 switches is illustrated in FIG. 3. The network 300 includes cross-routes where the distance between CE and various switches can be computed. For example, the cross-routes in the first stage (such as cross-route 302) have a distance of 1, which is $2^{Z-1}$ where Z=1 (Z corresponding to the stage). The cross-routes in the second stage (such as cross-route 304) have a distance of 2, which is $2^{Z-1}$ where Z=2. The cross-routes in the third stage (such as cross-route 306) have a distance of 4, which is $2^{Z-1}$ where Z=3. The cross-routes in the fourth stage (such as cross-route 308) have a distance of 8, which is $2^{Z-1}$ where Z=3. Further, a radix boundary can be defined (illustrated by the dotted lines) as the boundary each cross-route crosses in realizing a fat tree network. For example, routing between a CE and stage 1, the cross-route 302 crosses the radix boundary 310. Similarly, in transmitting data between stage 1 and stage 2, the cross-route 304 crosses boundary 312. Likewise, between stage 2 and stage 3, the cross-route 306 crosses boundary 314 and between stage 3 and stage 4, the cross-route 308 crosses boundary 316.

SUMMARY OF THE INVENTION

Systems and methods for implementing boundary-less hierarchical networks including (but not limited to) methods of generating such networks in accordance with embodiments of the invention are disclosed. In one embodiment, a hierarchical network in an integrated circuit, the hierarchical network includes a plurality of computing elements, where the plurality of computing elements have M outputs and N inputs, and a plurality of switches arranged into stages of switches wherein the plurality of computing elements are connected to switches in a first stage via routes, the switches in the first stage are connected to the plurality of computing elements and switches in a second stage via routes, where the switches in the second stage are connected to the switches in the first stage via routes, at least M+1 adjacent computing elements can connect to at least two nearest neighboring computing elements via a stage 1 switch, and every computing element can connect with every other computing element within the hierarchical network.

BRIEF DESCRIPTION OF THE DRAWINGS

In the course of the detailed description to follow, reference will be made to the attached drawings. These drawings show different aspects of the present inventions and, where appropriate, reference numerals are utilized to make specific references. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended to reflect or indicate the embodiment or embodiments is/are "example" embodiment(s) of, for example, the present inventions.

DETAILED DESCRIPTION

Turning now to the drawings, systems and methods for implementing boundary-less hierarchical networks including (but not limited to) methods of generating such networks in accordance with embodiments of the invention are illustrated. In many embodiments, a hierarchical network can include a plurality of computing elements (CEs) having M outputs and N inputs, where each CE can communicate with other CEs within the network using switches arranged in various stages. In several embodiments, each CE can be connected to switches in a first stage via various types of routes (e.g. single, double, un-directional, and/or bi-directional). In a variety of embodiments, the switches in the first stage can be connected to the CEs and switches in a second stage where the switches in the second stage can also be connected to the switches in the first stage and often to switches in a third stage. In many embodiments, boundary-less hierarchical networks have at least M+1 adjacent CEs that can connect to at least two nearest neighboring CEs via a stage 1 switch.

In several embodiments of the invention, a method of generating a radix-3 boundary-less architecture includes selecting a stage in a hierarchical network and identifying at least one center 2×2 routing track residing past the selected stage. The method further includes moving the at least one identified center 2×2 routing track to a routing channel prior to the selected stage. By repeating the identification and movement of center 2×2 routing tracks, one or more stages can be transformed into radix-3 boundary-less networks. In certain embodiments, the present inventions further include addressing unevenly distributed routing that may result from the aforementioned transformation. In several embodiments, unevenly distributed routing may be corrected by redistributing interconnect routing and/or by reducing the number of switches. As discussed further below, the techniques for creating boundary-less switch networks are not limited to any particular level of hierarchy, number of computing elements, or individual switch capacity.

Figure 1A:
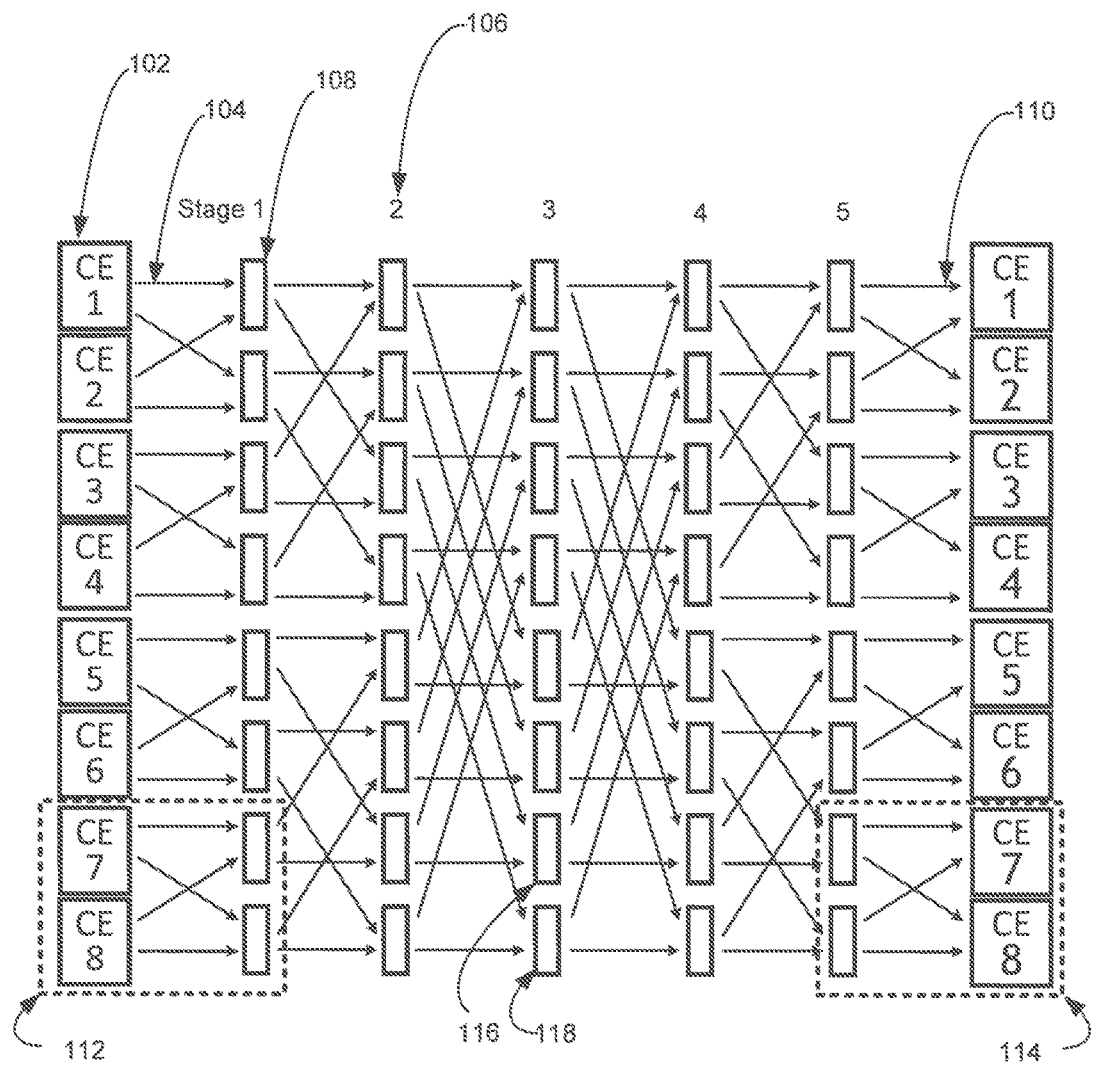
FIGS. 1A-C illustrate, in block diagram form, a Benes Network of 4 or 8 computing elements (CEs) with 3 or 5 stages of single- or double-route 2×2 switches.
Figure 1B:
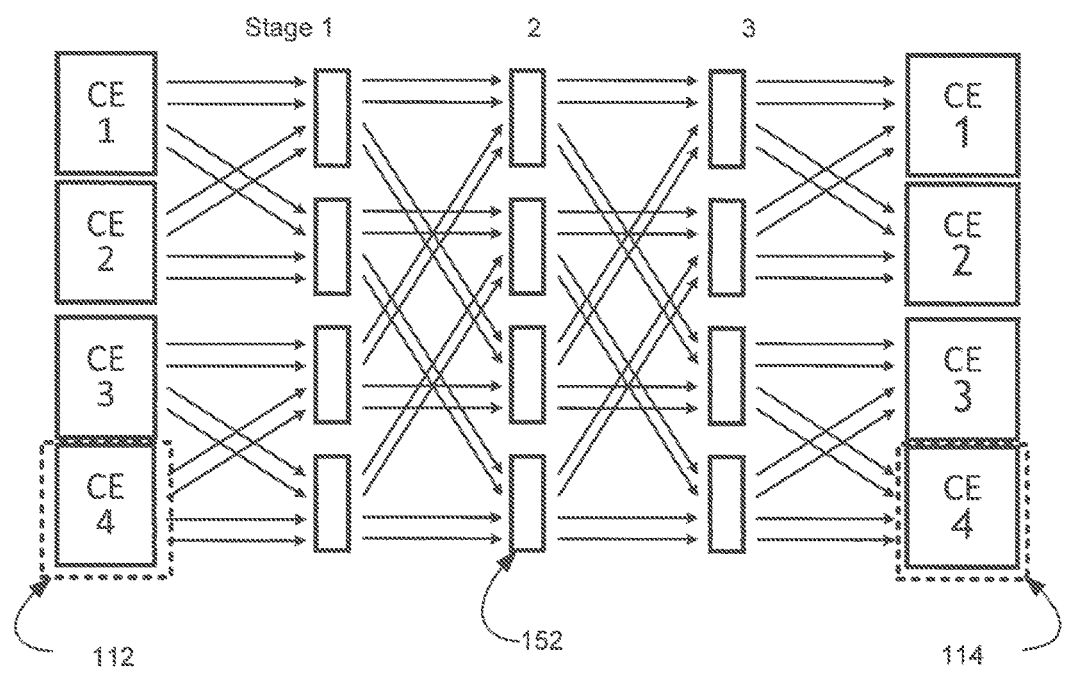
Figure 1C:
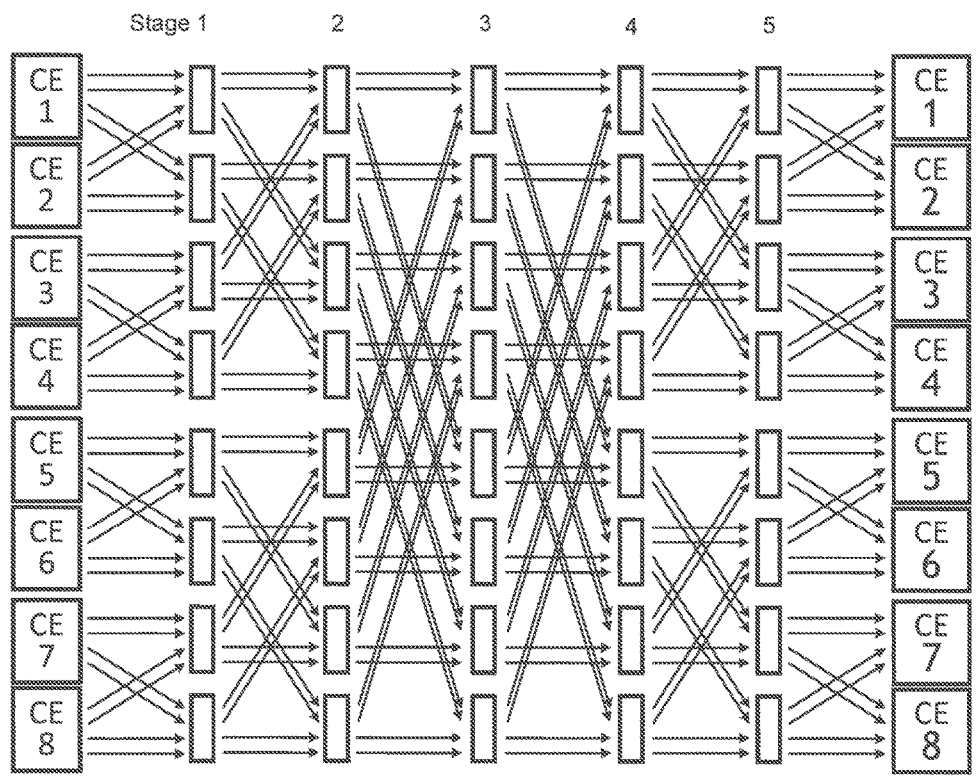
Figure 2:
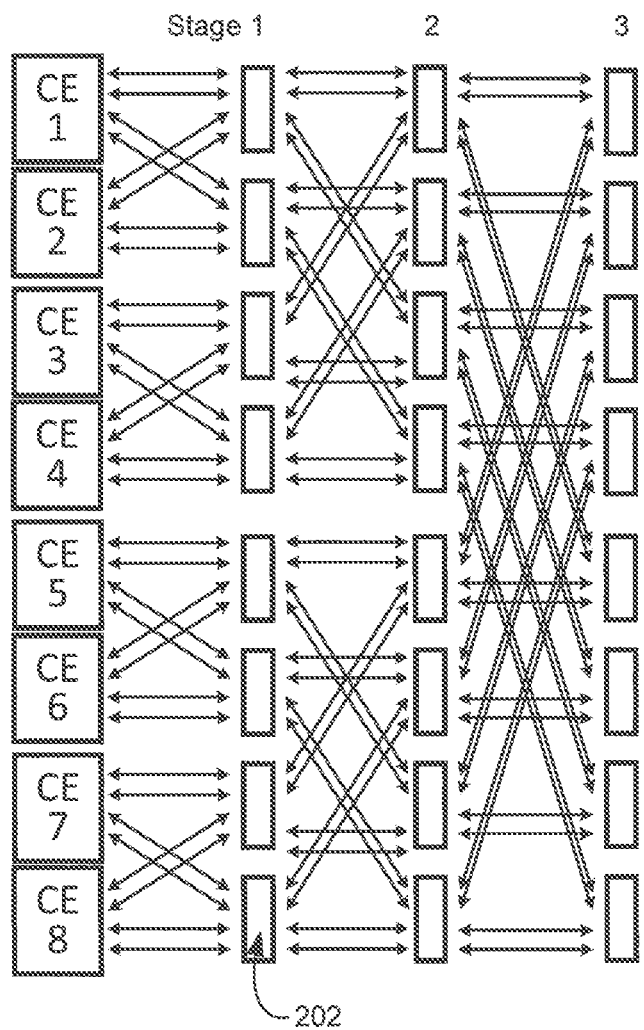
FIG. 2 illustrates, in block diagram form, a fat-tree network for a Benes network of 8 CEs with 3 stages of 2×2 switches.
Figure 2:
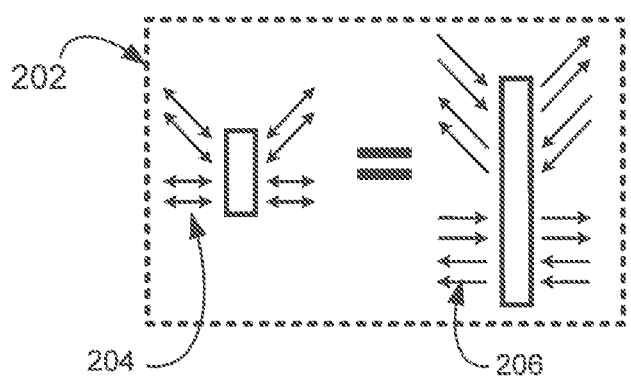
Figure 3:
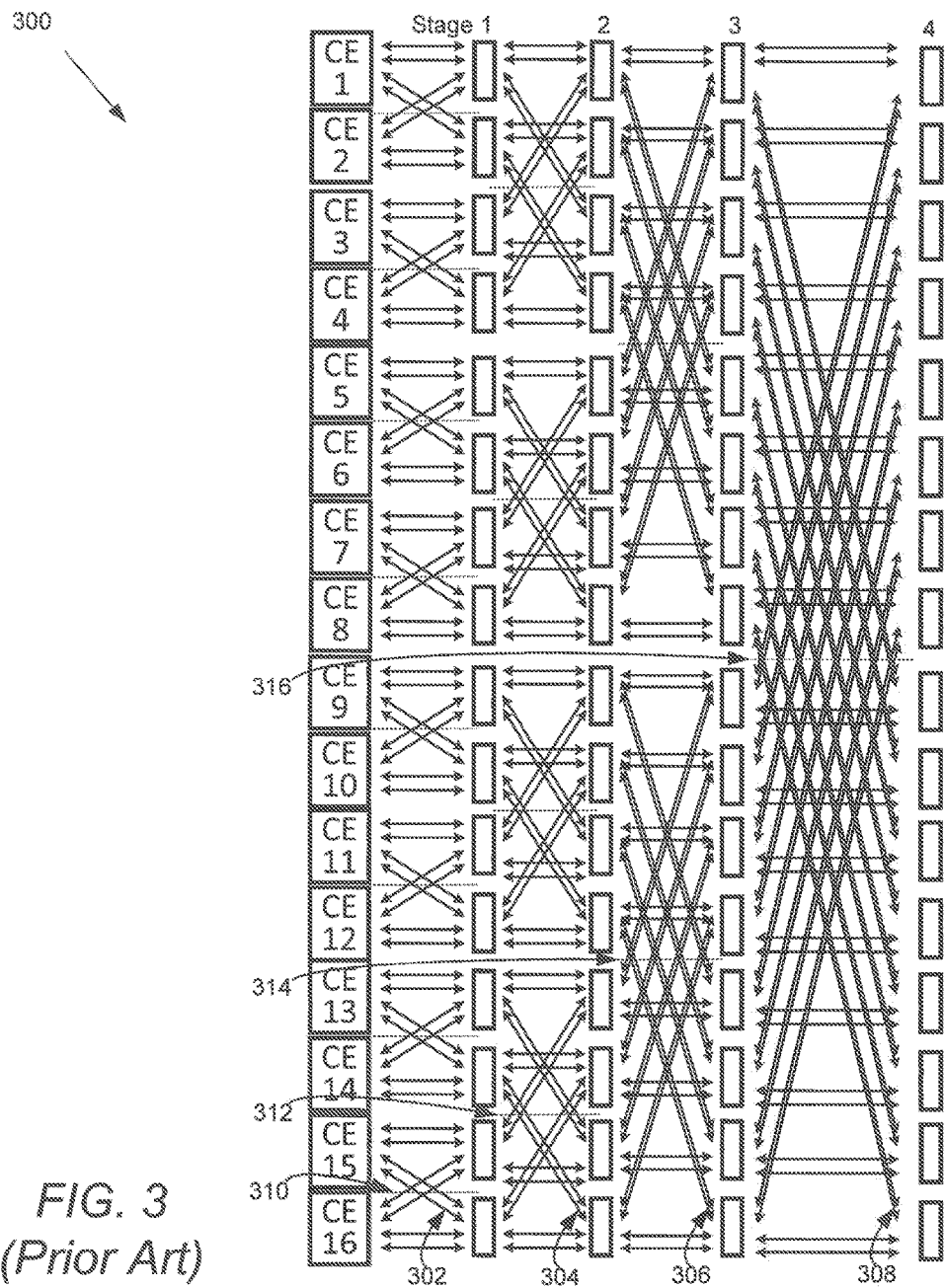
FIG. 3 illustrates, in block diagram form, a radix-2 fat-tree network of 16 CEs with 4 stages of 2×2 switches.

In various embodiments, a macro-based design implementation can be utilized in designing FPGAs to perform the techniques described below. In many embodiments, the FPGA designs can be made in consideration of heterogeneous interconnects and computing elements. In several embodiments, hierarchical design flows can be utilized. In still further embodiments, a top-level interconnect architecture can be visualized in the design process. As discussed above, while embodiments of the invention are often described in the context of FPGA circuitry embodiments of the invention can also be interpreted using applicable logic and/or computing circuitry including (but not limited to) processors, state machines, and gate arrays, programmable gate arrays and SOCs. For the sake of brevity, a separate discussion for each and every logic and/or computing circuit is not provided with respect to each aspect of the disclosed invention; however the applicability should be clear to one of ordinary skill in the art based on the instant disclosure Transformation of Radix-2 Network Stages into a Boundary-Less Radix-3 Network Generally, different CEs of a network can perform a variety of functions that contribute to the overall computation, storage, and/or communication functions using an interconnect network architecture. For hierarchical networks, local routing between CEs that cross one or more radix boundaries can be inefficient since the signals have to traverse many stages to communicate with each other. For example, in FIG. 3, although CE 8 and CE 9 are nearest neighbors (located adjacent to each other), in order to communicate with each other, signals have to traverse 4 stages of the network hierarchy. As further discussed below, a radix-2 network can be transformed to a boundary-less radix-3 network by transforming each stage of the network. Similarly, higher radix networks can also be transformed to boundary-less radix networks. Processes for generating or transforming one or more stages of a radix network to one or more stages of a boundary-less radix network and boundary-less radix network implementations in accordance with various embodiments of the invention are discussed further below.

Figure 4A:
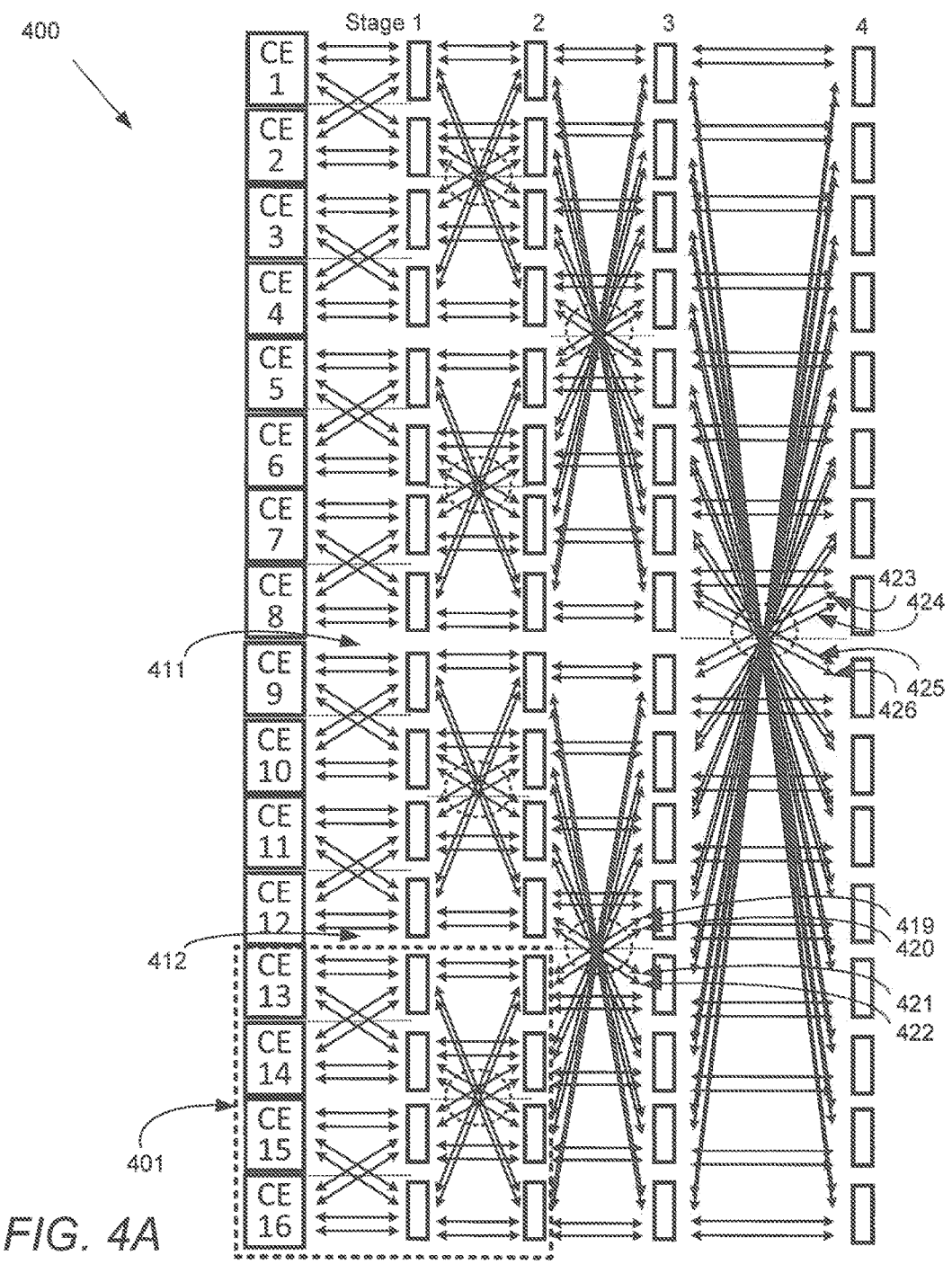
FIGS. 4A-H illustrate, in block diagram form and at various stages, an exemplary transformation of a radix-2 network to a radix-3 boundary-less network architecture, in accordance with an embodiment of the invention.
Figure 4B:
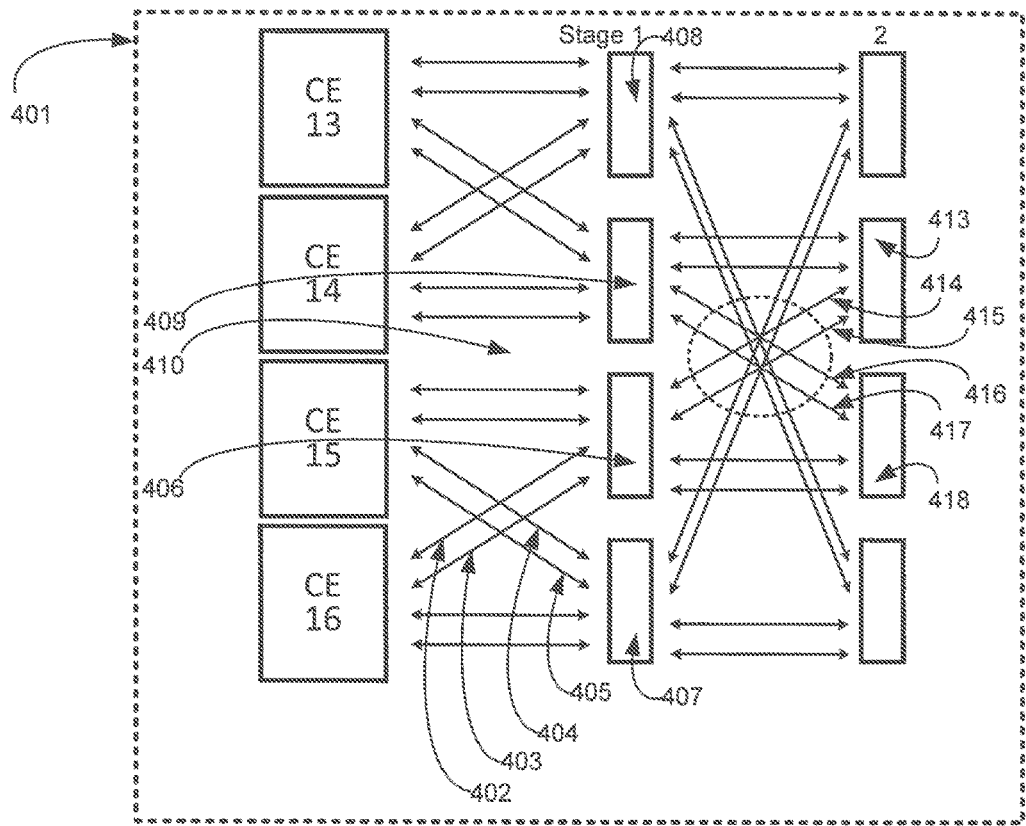

A fat tree network of 16 CEs with isomorphic transformations of a butterfly structure is shown in FIGS. 4A and 4B. The network 400 includes 16 CEs. For demonstration, CEs 13-16 and their first 2 stages of switches 401, are shown as set forth in FIG. 4B. For CEs 15 and 16, a set of cross-routes 402, 403, 404, 405 provide connections between CE 15 and CE 16 using stage 1 switches 406, 407 with a distance of 1. In many embodiments, such a cross-route connection can be defined as a set of wires linking 2 switches or CE and switches of a particular stage with switches or CEs of an immediate neighboring stage. A similar set of cross-routes exist for connection between CE 13 and 14 using switches 408, 409 (in the illustrated example, all cross-route connections between a CE and stage 1 switch have a distance of 1). However, when a cross route connection does not exist between a CE and switch (or switches of one stage and switches of immediately neighboring stage) a so called "gap" is present. For example, gap 410 is present between CE 14 and CE 15 and switches 409, 406. In other words, a gap is defined as a lack of cross-route connection between a set of switches, or between a set of CEs and switches. Other examples of gaps are pointed to by callouts 411 and 412.

In many embodiments, a boundary-less radix-3 transformation fills the gaps at the lower hierarchies by searching for available cross-routes from upper hierarchies (upstream, i.e. later stages) and moving them down to the lower hierarchies (downstream). In various embodiments, starting with a gap such as 410, a search can be conducted upstream to find a set of cross-routes with the appropriate distance (in this example the distance being 1, since existing stage 1 cross-routes have a distance 1). Such cross-routes can be upstream as identified as 414, 415, 416, and 417 (collectively "nets") connecting stage 1 switches 409, 406 and stage 2 switches 413, 418. The identified cross-routes have distance of 1, which meets the distance criteria for the lower hierarchy downstream. In many embodiments, these nets can be disconnected from their current switches to prepare for moving. Other cross-routes that meet the distance criteria for filling gaps between CE and stage 1 can be identified (as marked with dashed circles in FIGS. 4A and 4B). Such cross-routes can also be disconnected from their current switches and moved to lower hierarchies. In many embodiments, the cross-routes can come from other hierarchies, such as between stages 2 and 3, as marked by 419, 420, 421, and 422 which can be used to fill gap 412. Another set of cross-routes that meet the criteria can be found between stages 3 and 4, as marked by 423, 424, 425, and 426 which can be used to fill gap 411. In many embodiments, center 2×2 routing tracks (shortest routing tracks) for routing channels after a first stage can be identified for moving downstream (as marked with dashed circles in FIGS. 4A and 4B).

Figure 4C:
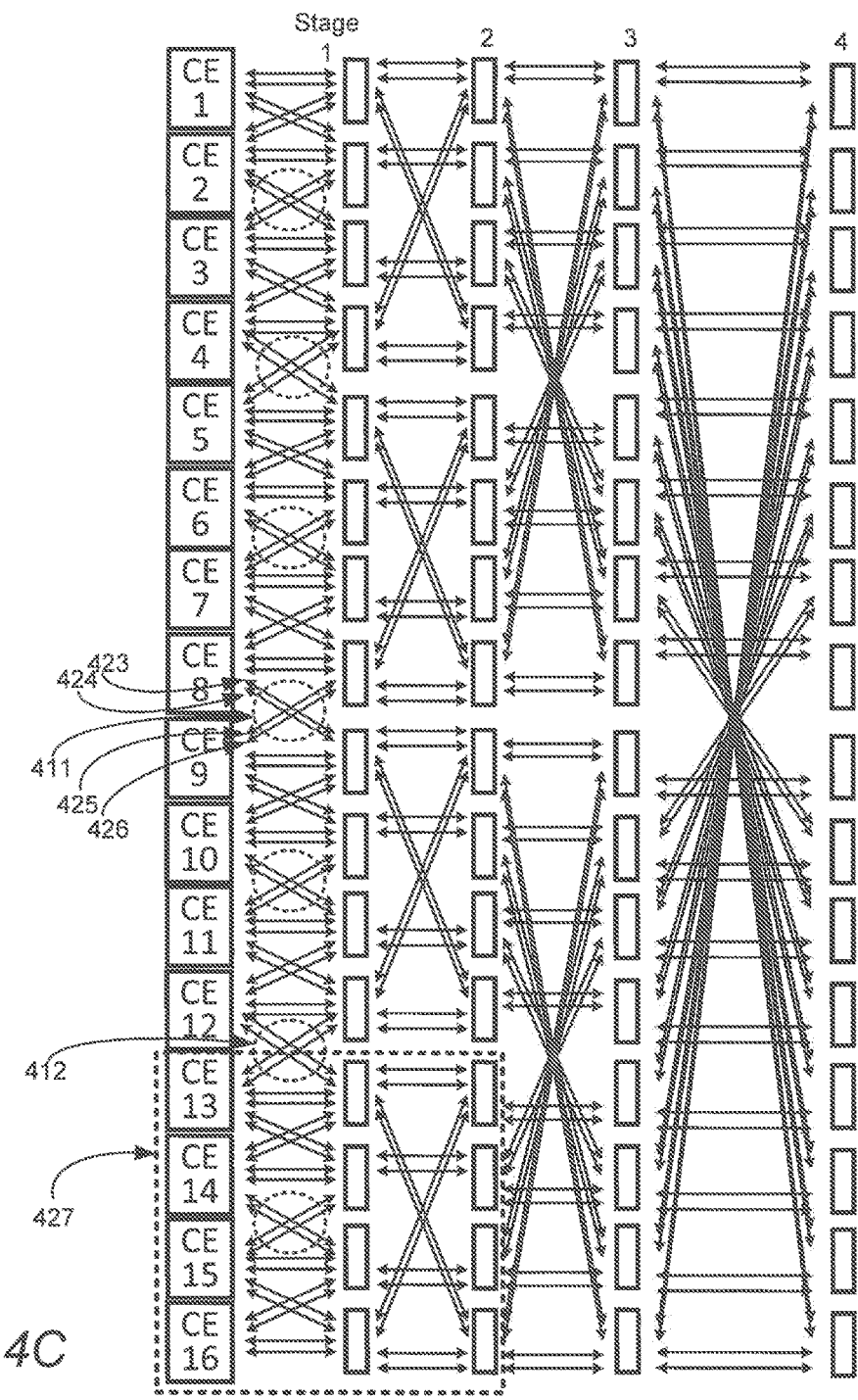
Figure 4D:
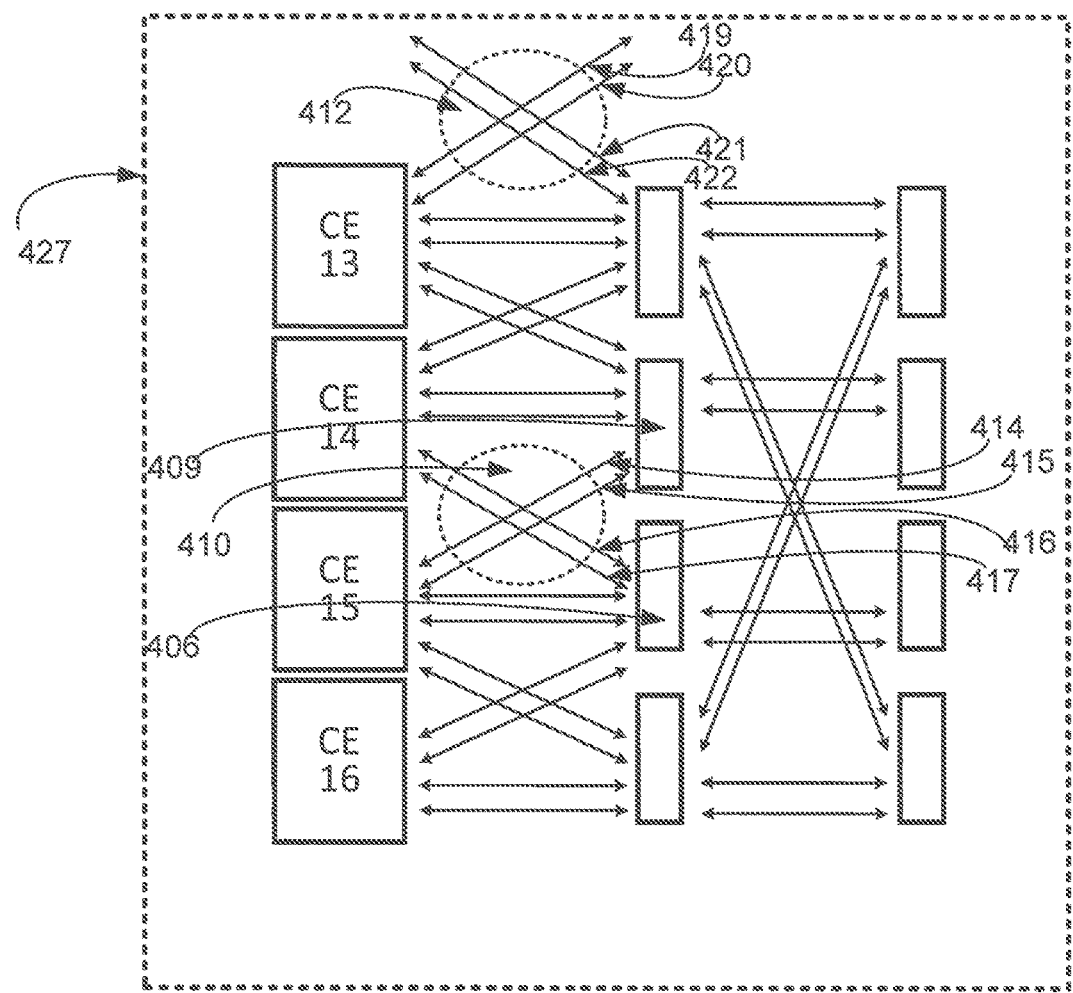

A fat tree network after moving the identified center 2×2 routing tracks to routing channels below the first stage to transform the first stage into a radix-3 boundary-less network in accordance with an embodiment of the invention is shown in FIG. 4C. In many embodiments, 2×2 routing tracks having an interconnect length of 1 are identified. As illustrated in the inset 427 of FIG. 4D, the 2×2 cross-routes 414, 415, 416, and 417 can be disconnected and moved from their previous location and rejoined connecting CEs 14, 15 with switches 409, 406 and filling the gap 410. Similarly, the 2×2 cross-routes 419, 420, 421, and 422 can be disconnected and moved from their previous location, and rejoined to fill the gap 412. Likewise, the 2×2 cross-routes 423, 424, 425, and 426 can be disconnected and moved from their previous location, and moved and rejoined to fill the gap 411.

Figure 4E:
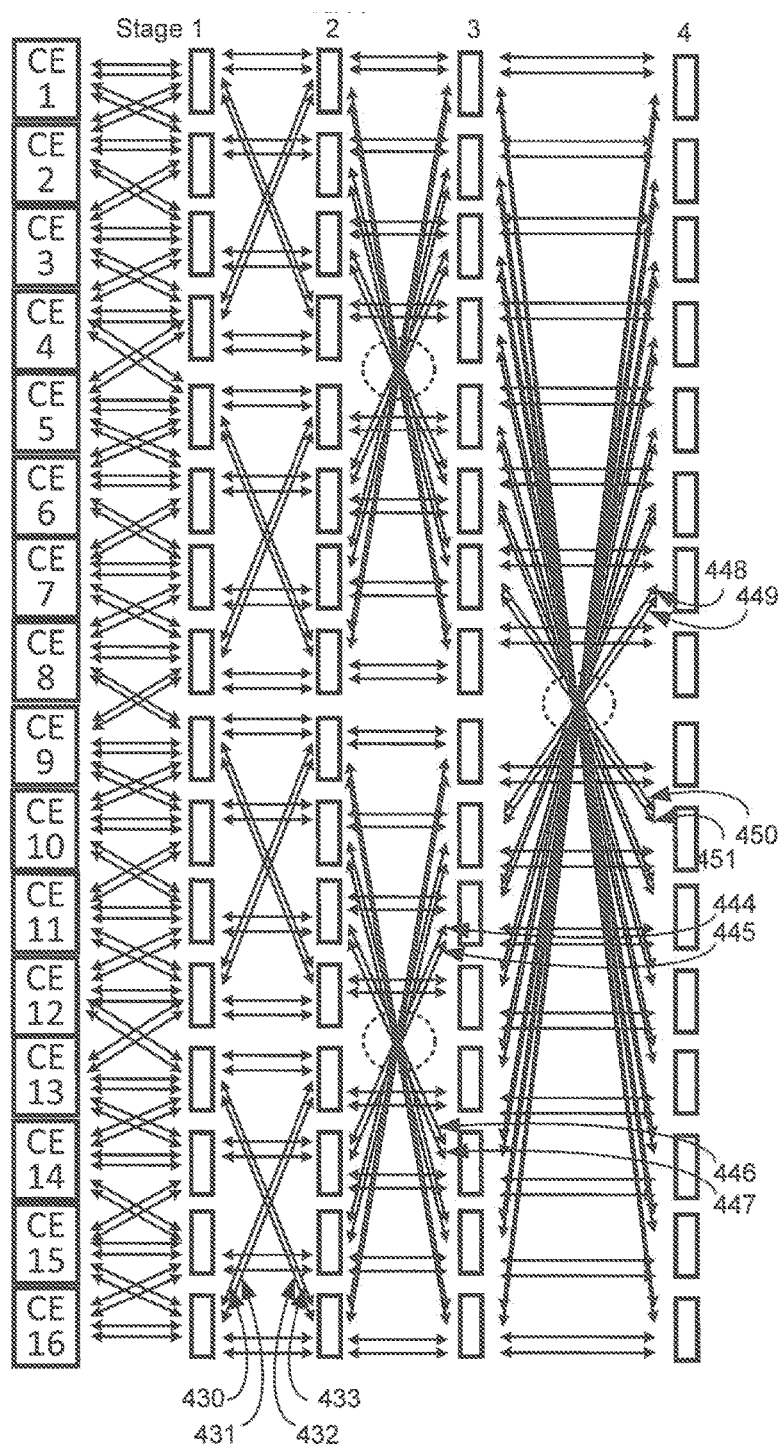

A fat tree network with center 2×2 routing tracks identified between a second stage and a third stage and between the third stage and a fourth stage in accordance with an embodiment of the invention is shown in FIG. 4E. After the movement of cross-routes as discussed above, the remaining cross-routes 430, 431, 432, and 433 between stage 1 and stage 2 have a distance of 3. In many embodiments, cross-routes with a distance of 3 can be identified (as marked with dashed circles in FIG. 4E) to disconnect and move downstream. Such cross-routes can come from between stages 2 and 3, as labeled by 444, 445, 446, and 447 or further upstream, as labeled by 448, 449, 450, and 451.

Figure 4F:
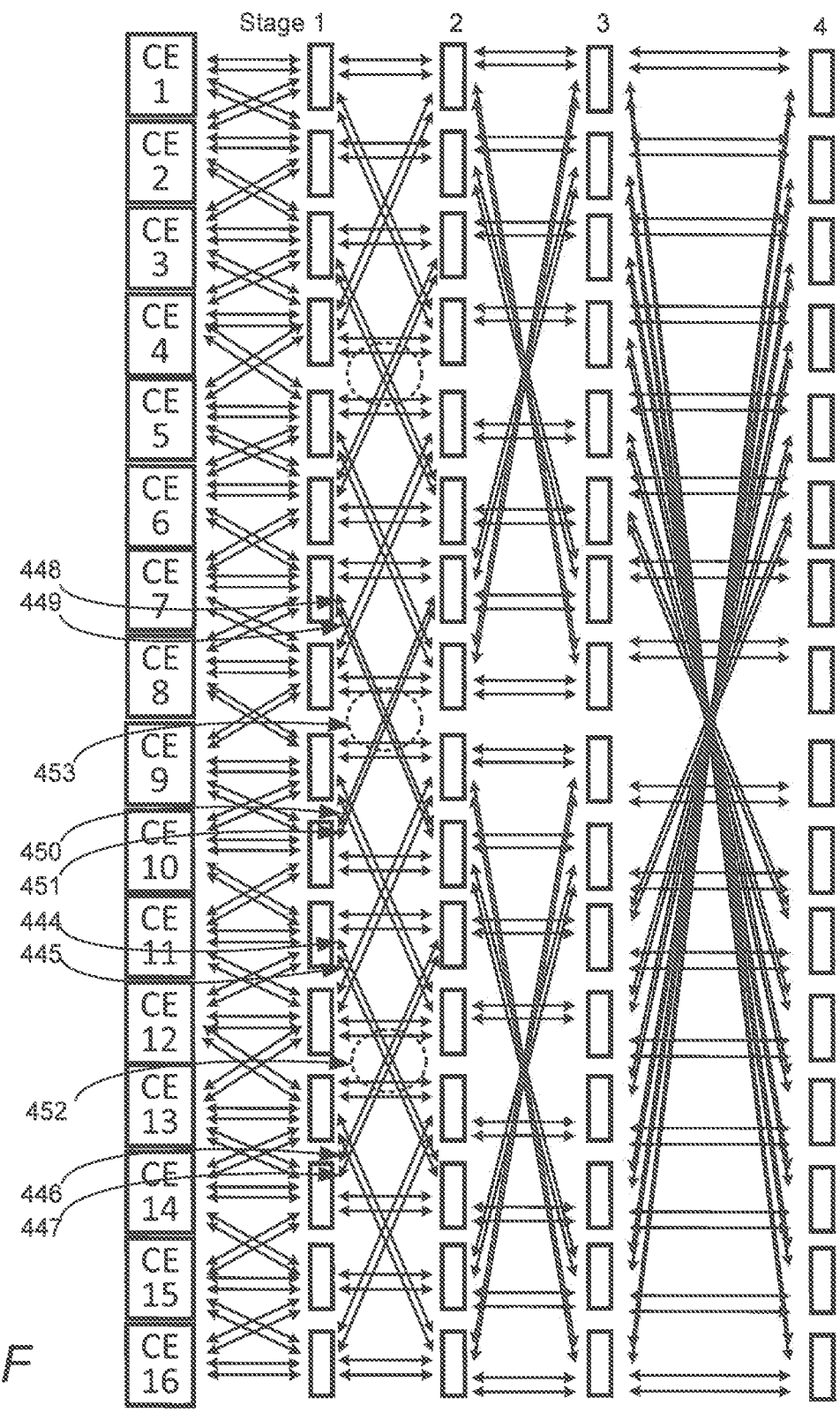

A fat tree network after moving identified center 2×2 routing tracks to routing channels between the first stage and the second stage to transform the second stage into a radix-3 boundary-less network in accordance with an embodiment of the invention is shown in FIG. 4F. In several embodiments, 2×2 routing tracks having an interconnect length of 3 can be identified as described above. The 2×2 cross-routes 444, 445, 446, and 447 can be disconnected (and moved from their previous location), and rejoined to fill the gap 452. Similarly, the 2×2 cross-routes 448, 449, 450, and 451 can be disconnected (and moved from their previous location) and rejoined to fill the gap 453.

Figure 4G:
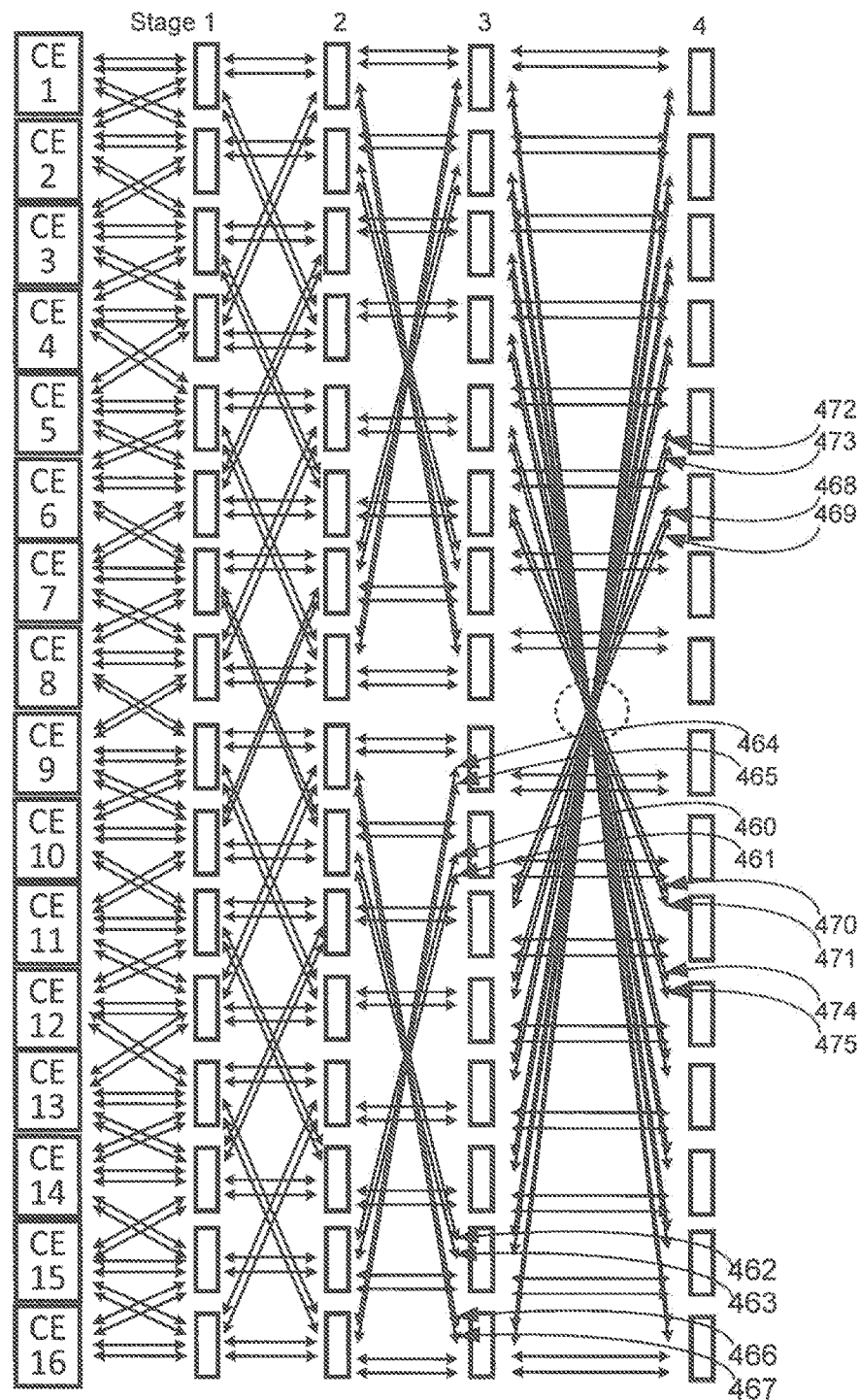

A fat tree network with center 2×2 routing tracks identified between the third stage and the fourth stage in accordance with an embodiment of the invention is shown in FIG. 4G. In many embodiments, the cross-routes between stage 2 and stage 3 can have a distance of 5, as identified by label 460, 461, 462, and 463, or a distance of 7, as identified by label 464, 465, 466, and 467. In several embodiments, cross-routes with a distance of 5 and 7 (as circled) can be identified upstream to disconnect and move downstream. As illustrated, the cross-routes with a distance of 5 upstream include 468, 469, 470, and 471. Cross-routes with a distance of 7 include 472, 473, 474, and 475.

Figure 4H:
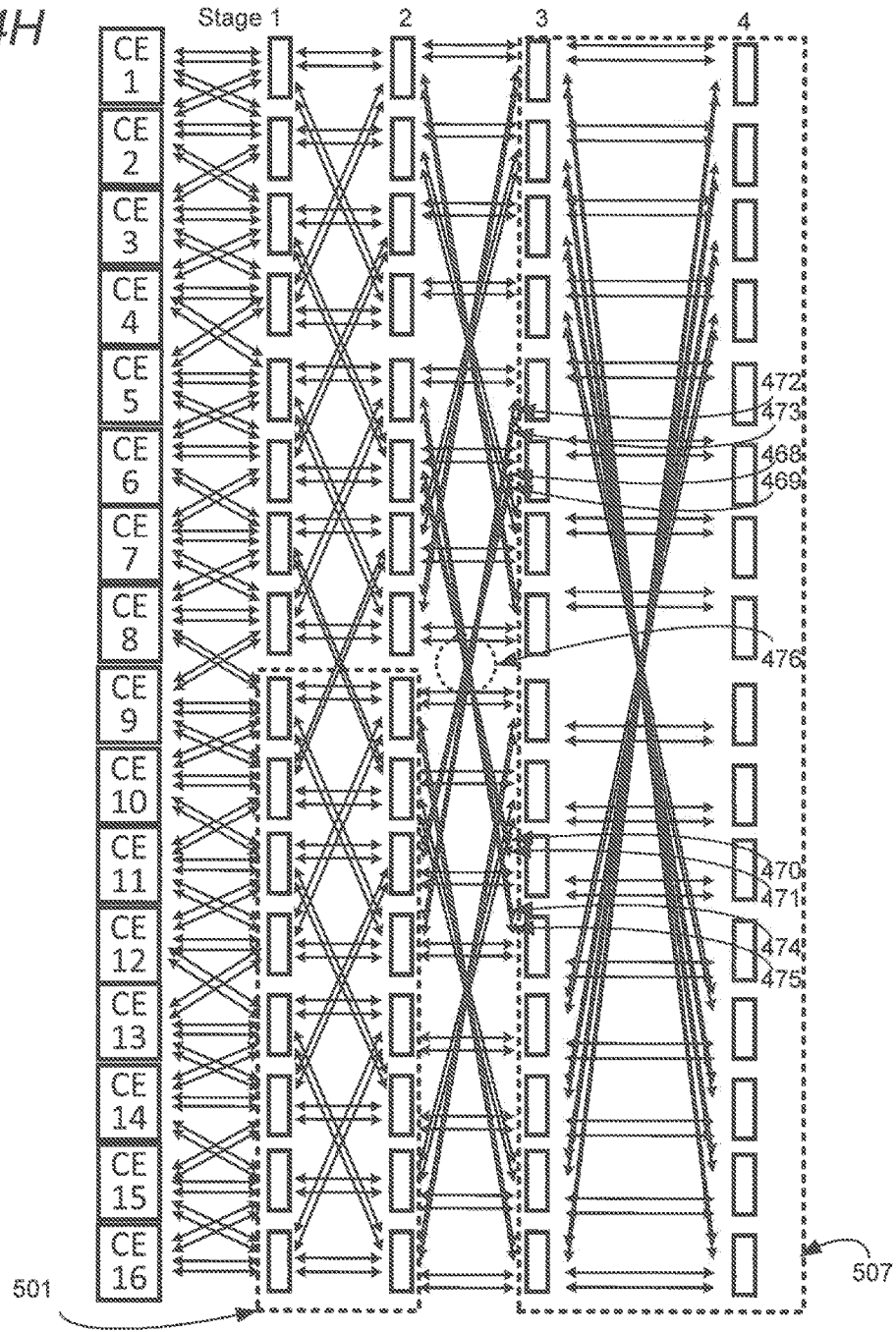

A fat tree network after moving the identified center 2×2 routing tracks to routing channels between the second stage and the third stage to transform the third stage into a radix-3 boundary-less network in accordance with an embodiment of the invention is shown in FIG. 4H. The 2×2 cross-routes 468, 469, 470, 471, 472, 473, 474, and 475 can be disconnected and moved from their previous location, and rejoined to fill the gap 476 as discussed above.

Although specific transformations of a radix-2 network into a boundary-less radix-3 network are discussed above with respect to FIGS. 4A-H, the stage-by-stage transformation as described above can be continued to the top of any hierarchy. Alternatively, the transformation can stop at any hierarchy and preserve the remaining upper hierarchies as traditional radix-2 networks. Further, although FIGS. 4A-H illustrate the transformation into a radix-3 boundary-less architecture, similar techniques can be used with respect to an arbitrary number of CEs and for higher radices where a radix-6 architecture can be used as an expansion to a radix-4 network, a radix-12 architecture can be used as an expansion to a radix-8 network, and so on. Furthermore, although specific numbers of tracks per channel (i.e. 2×2 routing tracks) are discussed above with respect to FIGS. 4A-H, any combination of tracks in a channel as appropriate to the requirements of a specific application can be utilized in accordance with embodiments of the invention.

As discussed above, in various embodiments, the techniques described herein may be implemented using one or more processors (suitably programmed) to perform, execute and/or assess one or more of the functions or operations described herein to generate the switch networks or architectures of the present inventions.

Forming a Regular Routing Pattern by Redistributing Interconnect Routing

In transforming a traditional network to a boundary-less network (for example a radix-2 into a boundary-less radix-3 network), the system and/or network may include unevenly distributed routing patterns (i.e. some switches have to connect more routing than others). Unevenly distributed routing can occur because the wires above a first stage have been reduced by 50%. Under these circumstances, it may be advantageous to form a regular (evenly distributed) routed system by redistributing the interconnect routing.

Figure 5A:
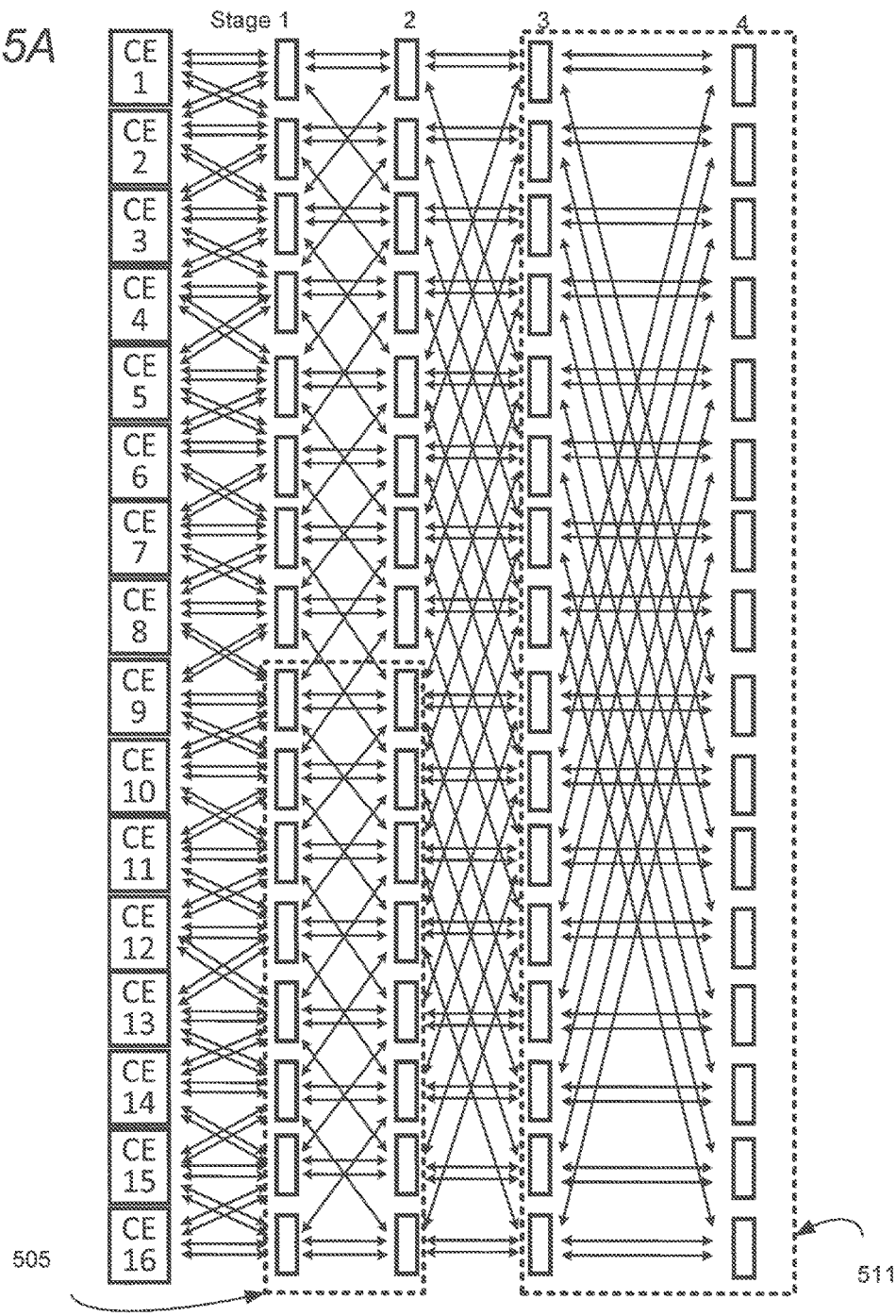
FIGS. 5A-C illustrate, in block diagram form and at various stages, an exemplary embodiment of evenly distributing routing of a boundary-less radix-3 network, in accordance with an embodiment of the invention.
Figure 5B:
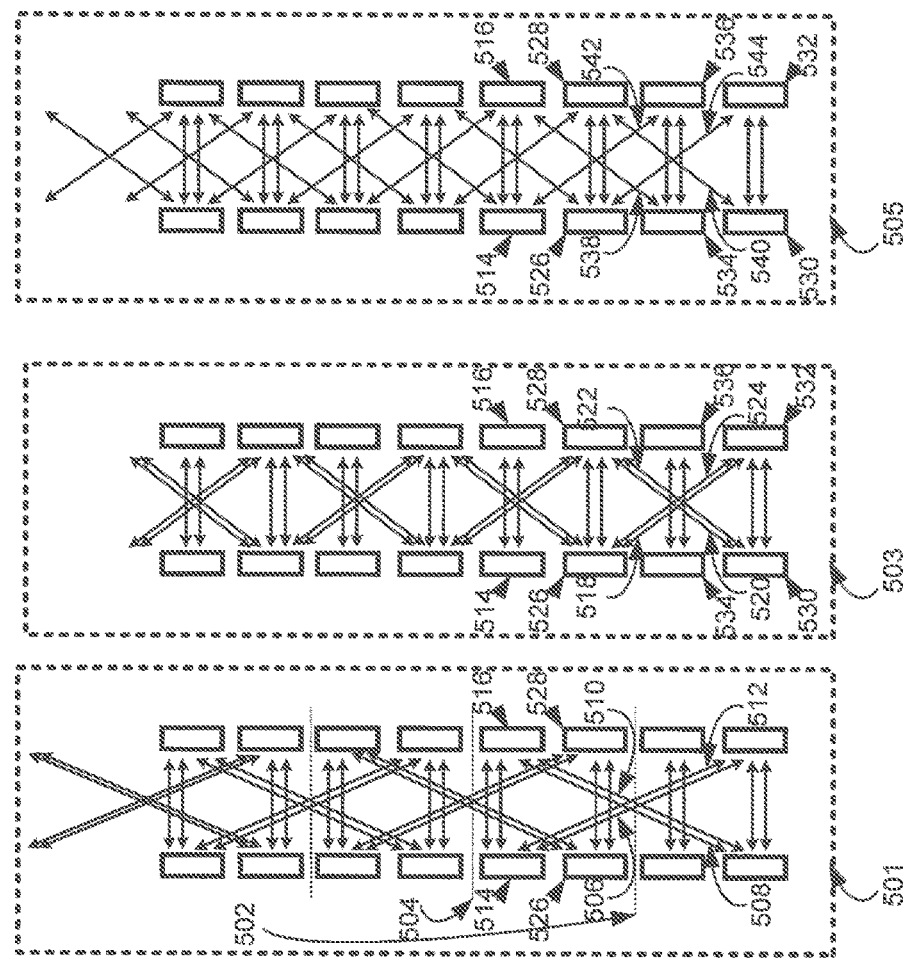
Figure 5C:
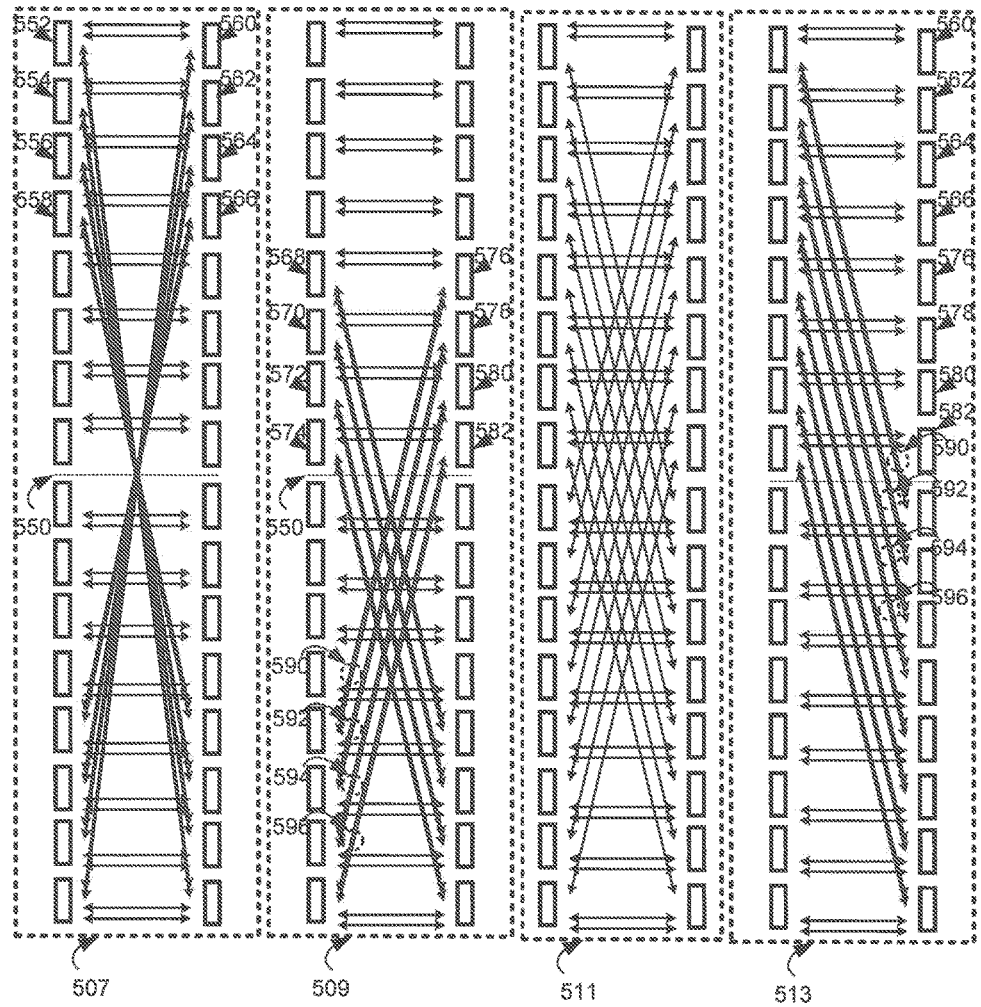

A boundary-less radix-3 network formed by redistributing interconnect routing in accordance with an embodiment of the invention is illustrated in FIGS. 5A-C. FIG. 5B inset 501 illustrates a section of the network (see also FIG. 4H), which has not yet been modified for redistribution. Looking at the radix boundaries labeled 502 and 504, transformation into boundary-less networks can create new radix boundaries such as 504. In many embodiments, although the cross-routes can have a distance of 3 (such as 506, 508, 510, 512), to cross the radix boundary only a distance of 2 ($2^{Z-1}$, where Z corresponds to the stage and here Z=2) may be needed. Such cross-routes can be shortened to a distance of 2, as illustrated in inset 503 of FIG. 5B. Here, the cluster of cross-routes ("net") 518, 520, 522, and 524 (previously 506, 508, 510, and 512 before shortening and disconnecting from switches 514 and 516) can be connected to switches 526 and 528, while the other end remains connected to switches 530 and 532.

In inset 503, the cross-routes can be in pairs, such as 518, 520, 522, and 524 connecting to switches 526, 528, 530, and 532, but some switches can have gaps, such as between switches 514, 534, and 516, 536. In various embodiments, the cross-route pair can be separated into single cross-routes, where one set of single cross-routes is moved to a contiguous neighboring switch, as illustrated in inset 505. In inset 505, formally pair cross-routes 518, 520, 522, and 524 (in inset 503) can be split into single cross-routes (538, 540, 542, 544) to connect switches 514, 534, and 516, 536, where cross-route 540 and 544 remain connected to switches 526, 528, 530, and 532.

In several embodiments, similar transformations can be applied for various other stages. FIG. 5C inset 507 illustrates a section of the network (see also FIG. 4H), which has not yet been modified. A radix boundary is labeled by dotted line 550. For this hierarchy, the distance for the cross-routes can be 8, as defined by $2^{Z-1}$ where Z=4. The nets are then disconnected from switches 552, 554, 556, 558, 560, 562, 564, and 566 and shortened to a distance of 8, and then connected to switches 568, 570, 572, 574, 576, 578, 580, and 582 as illustrated in inset 509. The cross-route pairs are then separated into single cross-routes, and one set of cross-routes is moved to a contiguous set of neighboring switches, as shown in inset 511 (see also FIG. 5A).

In various embodiments, an alternative method can be used to separate the cross-route pairs and move one of its branches. As illustrated in inset 509, in FIG. 5C, switches 590, 592, 594, and 596 can be moved by mirroring the routes horizontally (along a vertical axis such that data travels in the same direction as the other branch) and moved to a contiguous set of neighboring switches, as shown in inset 513. As illustrated in inset 513, in FIG. 5C, in many embodiments, such methods allow switches such as 560, 562, 564, 566, 576, 578, 580, and 582 to no longer connect to any cross-route connections, and thus can be pruned, resulting in a 50% reduction in the number of switches in stages 4 and higher (see also FIG. 7).

Forming a Regular Routing Pattern by Pruning the Number of Switches

As discussed above, transforming a radix-2 into a boundary-less radix-3 network can result in unevenly distributed routing. To form a regular routing pattern, it may be advantageous to implement pruning processes to reduce the number of switches employed above a certain hierarchy.

Figure 6:
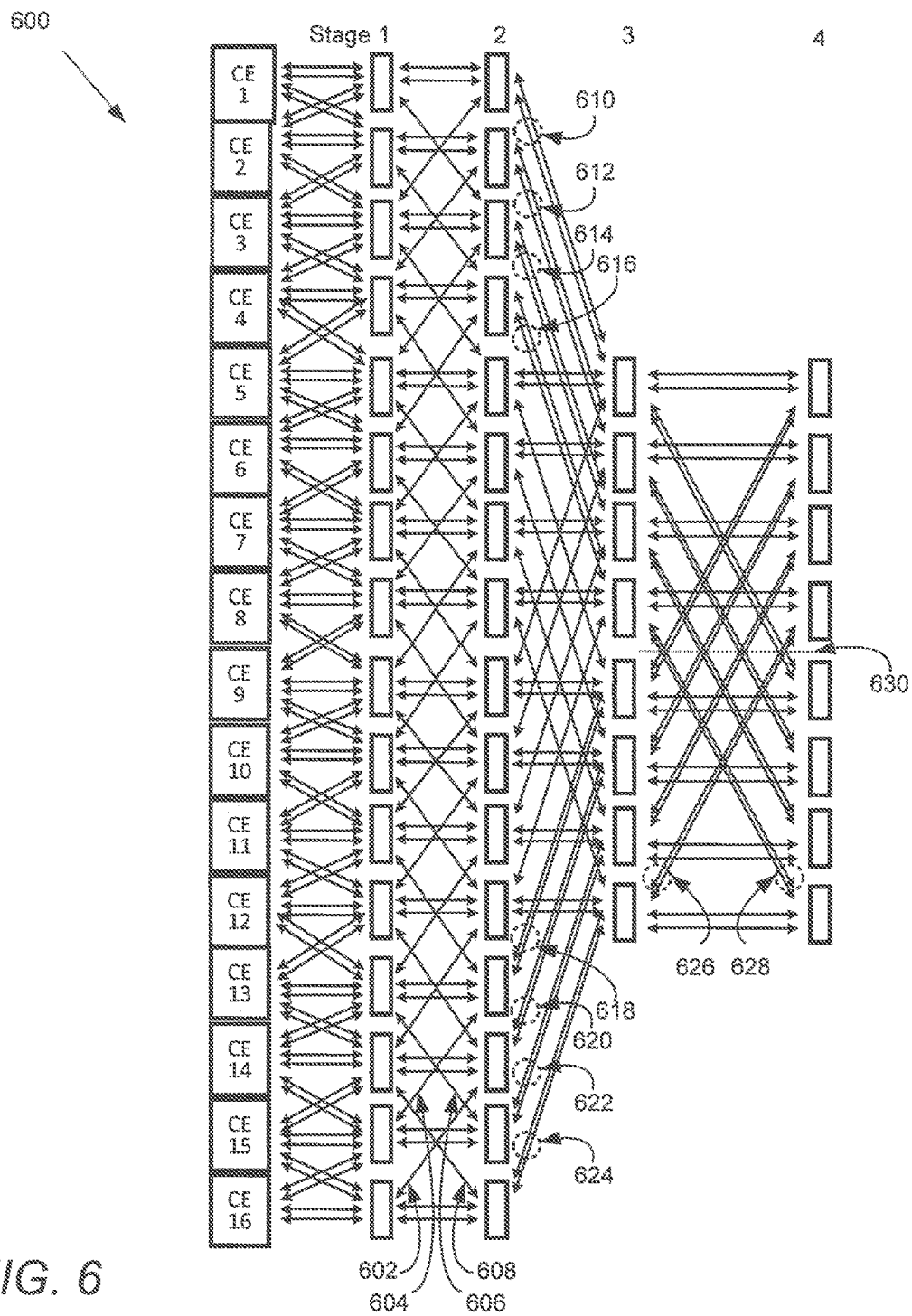
FIG. 6 illustrates, in block diagram form, an exemplary boundary-less radix-3 network with switches pruned at a third stage, in accordance with an embodiment of the invention; notably, in this exemplary embodiment, boundary-less radix-3 network includes shorter wire length between the third stage and a fourth stage and 50% fewer fourth stage switches (relative to an unpruned network).

A boundary-less radix-3 network with switches pruned at a third stage resulting in shorter wire length for interconnects between the third and fourth stages resulting in 50% fewer fourth stage switches in accordance with an embodiment of the invention is illustrated in FIG. 6. In many embodiments, the switches in the third stage can be pruned by moving wires to a double wire, reducing the number of third stage switches by half. In several embodiments, the remaining third stage switches can be centered resulting in shorter interconnect lengths for wires between the third and fourth stages and reducing the number of switches in the fourth stage by half. The network 600 illustrates a transformation to a boundary-less network employing the various techniques discussed above. The cross-route pairs between stages 1 and 2 can be separated into single cross-routes (for example 602, 604, 606, and 608) utilizing redistribution methods discussed above. For the cross-routes between stages 2 and 3, similar techniques can also be applied. Further, methods of shortening as described above can be applied to cross-route pairs such as 610, 612, 614, 616, and 618, 620, 622, 624 resulting in a 50% reduction in the number of switches in stages 3 and higher. Due to pruning, the cross-routes between stage 3 and 4, such as 626 and 628, only need a distance of 4 to cross the radix boundary 630 and thus the cross-routes can be shortened and implemented with a distance of 4.

Figure 7:
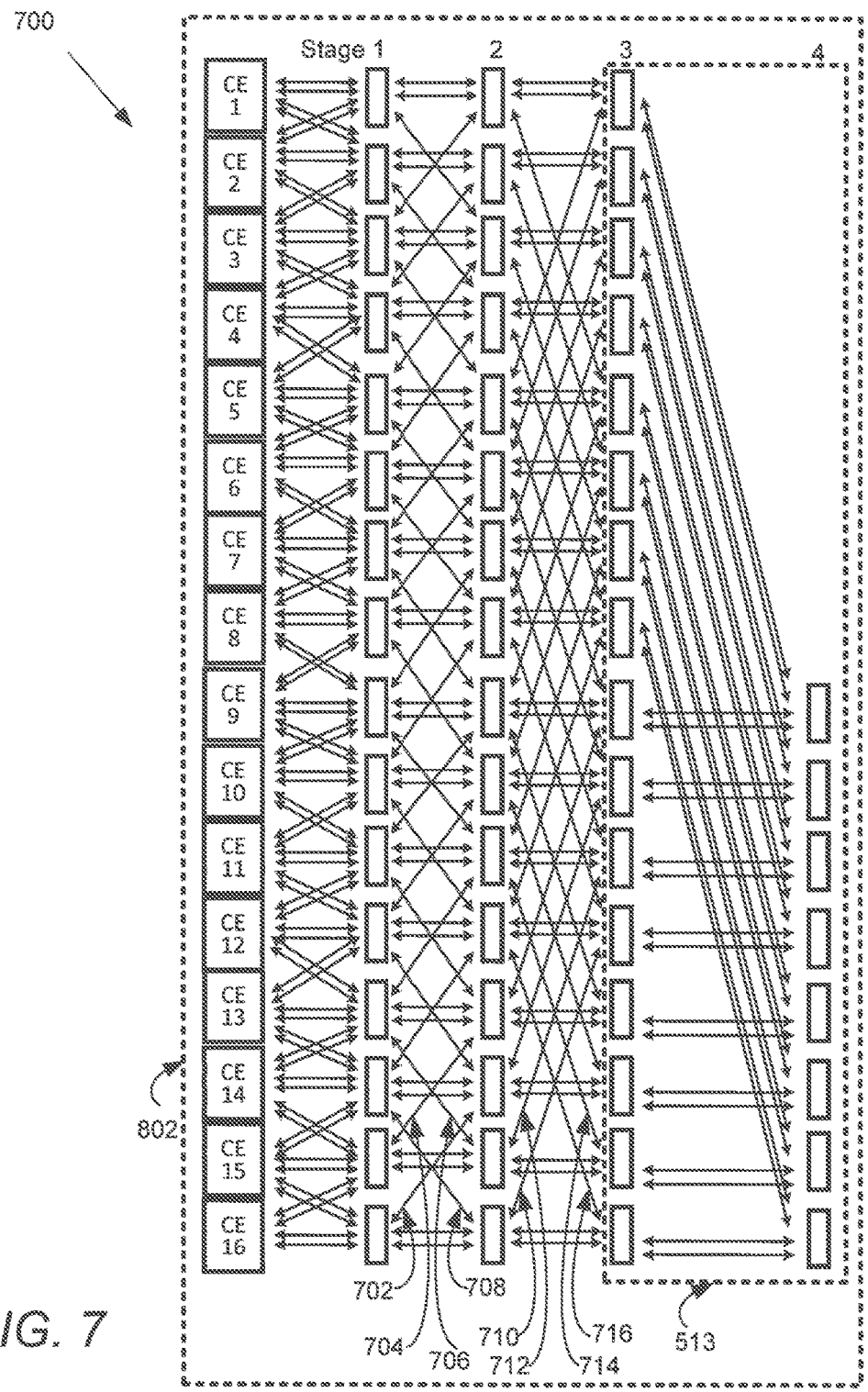
FIG. 7 illustrates, in block diagram form, an exemplary boundary-less radix-3 network with switches pruned at a fourth stage, in accordance with an embodiment of the invention.

A boundary-less radix-3 network with switches pruned at a fourth stage in accordance with an embodiment of the invention is illustrated in FIG. 7. In many embodiments, the switches in the fourth stage are pruned by moving wires allowing for a reduction in the number of fourth stage switches by half. In several embodiments, the fourth stage switches reside on half of the network, reducing the wire length of upper hierarchies. The network 700 illustrates transformation to a boundary-less network employing the various techniques discussed above. The cross-route pairs between stages 1 and 2 can be separated into single cross-routes (for example 702, 704, 706, and 708) utilizing redistribution methods discussed above. For cross-routes between stages 2 and 3, similar techniques can also be applied resulting in single cross-routes 710, 712, 714, and 716. For cross-routes between stages 3 and 4, methods discussed above can be applied resulting in a 50% reduction in the number of switches in stages 4 and higher.

Figure 8:
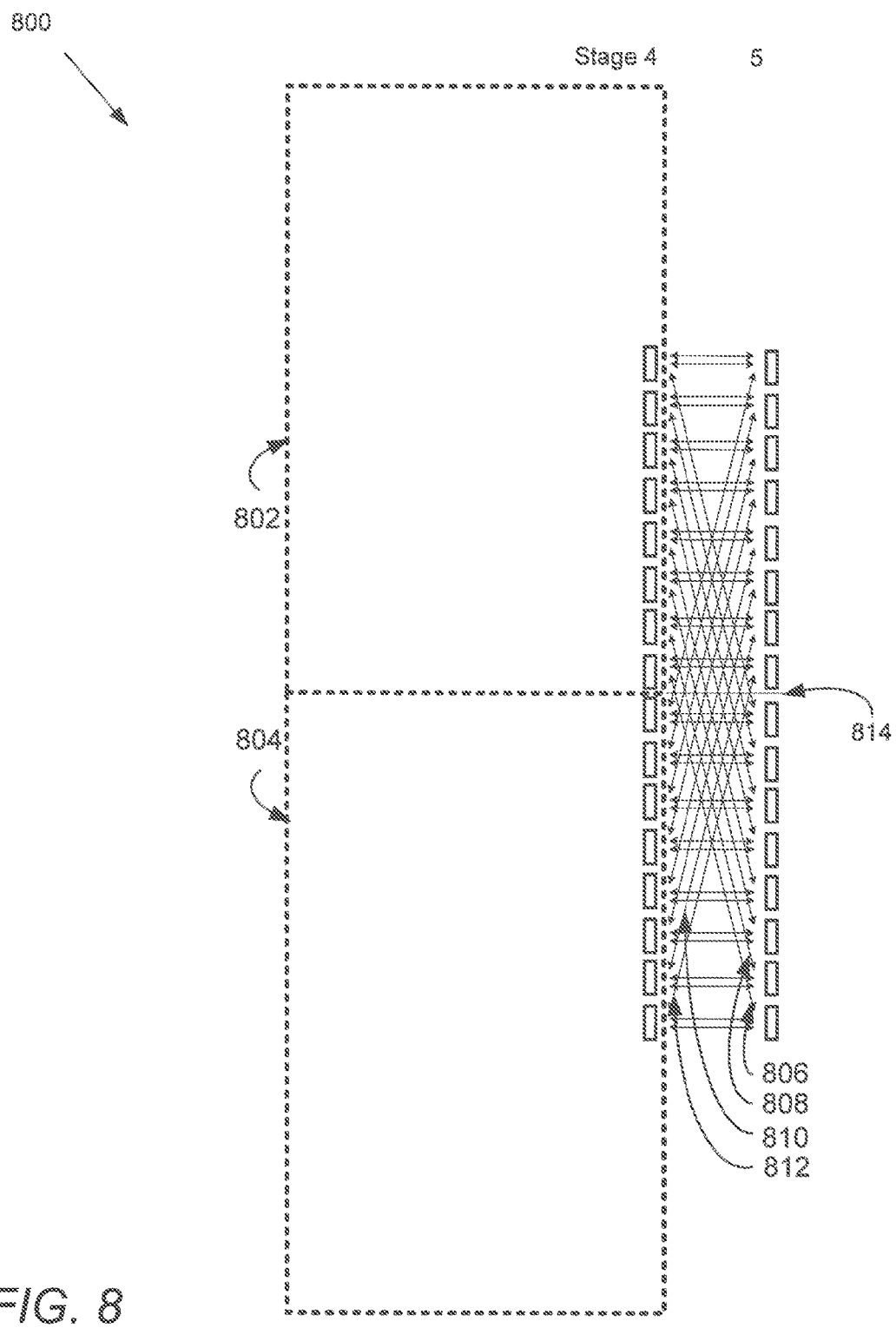
FIG. 8 illustrates, in block diagram form, an exemplary boundary-less radix-3 network with switches pruned at a fourth stage, resulting in shorter wire length between the fourth stage and a fifth stage and 50% fewer fifth stage switches, in accordance with an embodiment of the invention.

A boundary-less radix-3 network with switches pruned at a fourth stage resulting in shorter wire length for interconnects between the fourth stage and a fifth stage and 50% fewer stage 5 switches in accordance with an embodiment of the invention is illustrated in FIG. 8. In many embodiments, the 16 CE networks can each have fourth stage switches occupy only half of its local network thus reducing the wire length for interconnects between the fourth and fifth stages and reducing the number of switches in stage 5 by half. In the network 800, network 700 in FIG. 7 is abstracted as 802, and copied and mirrored vertically (along a horizontal axis) as 804. Structures 802 and 804 are connected via switches in stages 4 and 5, and cross-route pairs such as 806, 808, 810, and 812. Due to pruning, the cross-routes between stage 4 and 5, such as 806, 808, 810, and 812 can be implemented to cover a distance of 8 to cross the radix boundary 814 and thus the cross-routes can be implemented with a distance of 8.

Although specific techniques for forming regular routing patterns by pruning are discussed above with respect to FIGS. 5-8, any of a variety of techniques as appropriate to the requirements of a specific application, including redistributing interconnect routings and pruning the number of switches applied to various stages in different hierarchies, can be utilized in accordance with embodiments of the invention.

Boundary-Less Radix-4 Network

As discussed above, the techniques for creating boundary-less networks are not limited to any particular level of hierarchy, number of computing elements, or individual switch capacity.

Figure 9A:
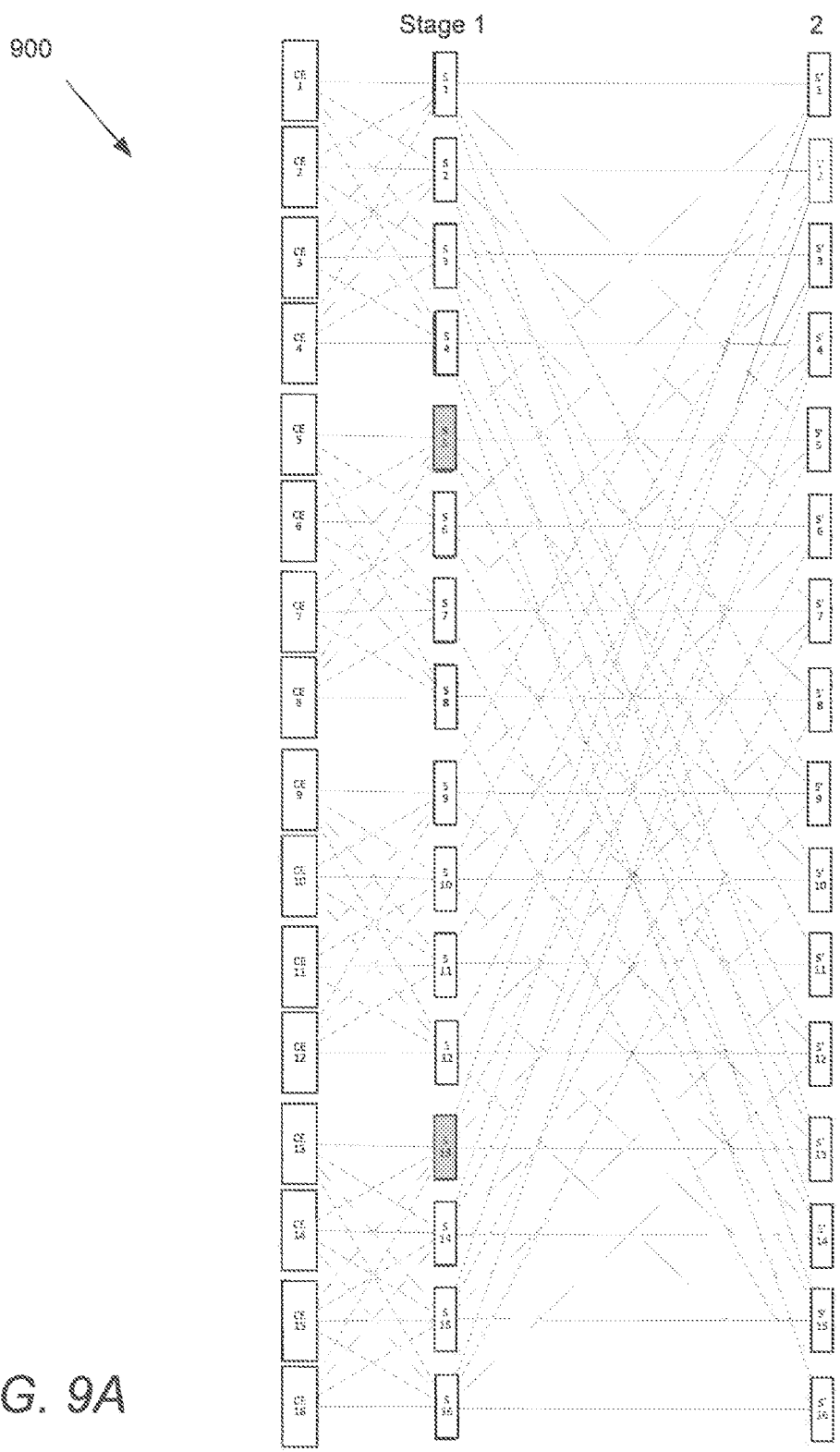
FIGS. 9A-B illustrate, in block diagram form, a radix-4 fat-tree network of 16 CEs with 2 stages of 4×4 switches.
Figure 9B:
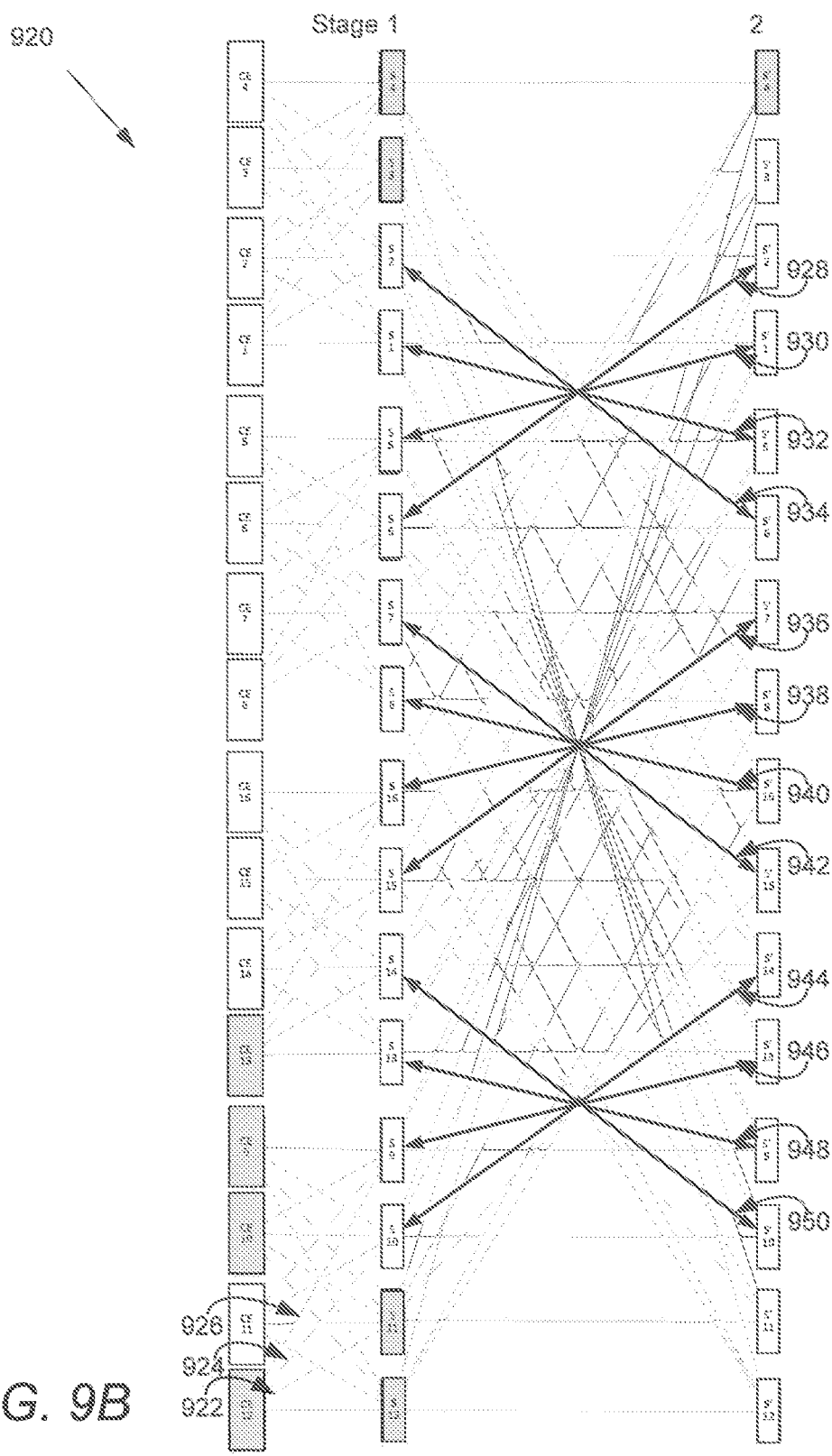

A radix-4 fat-tree network of 16 CEs with 2 stages of 4×4 switches is illustrated in FIG. 9A. The CEs and switches have been labeled for clarity in the network 900. An isomorphic transformation can be performed on this network by moving around the CEs and the switches, but not disconnecting and rejoining any nets resulting in the transformation as illustrated in FIG. 9B. The network 920 is functionally identical to 900. All cross-routes in the first stage have a distance of 1, 2, or 3, as labeled in 922, 924, and 926, respectively. Cross-routes with a distance of 1, 2, or 3 from all other hierarchies can be identified, such as cross-routes 928, 930, 932, 934, 936, 938, 940, 942, 944, 946, 948, and 950. In this example, the cross-routes selected only have a distance of 1 or 3, but not 2. Following the radix-2 methodology as described above, these cross-routes can be disconnected from their current switches in preparation for moving.

Figure 10:
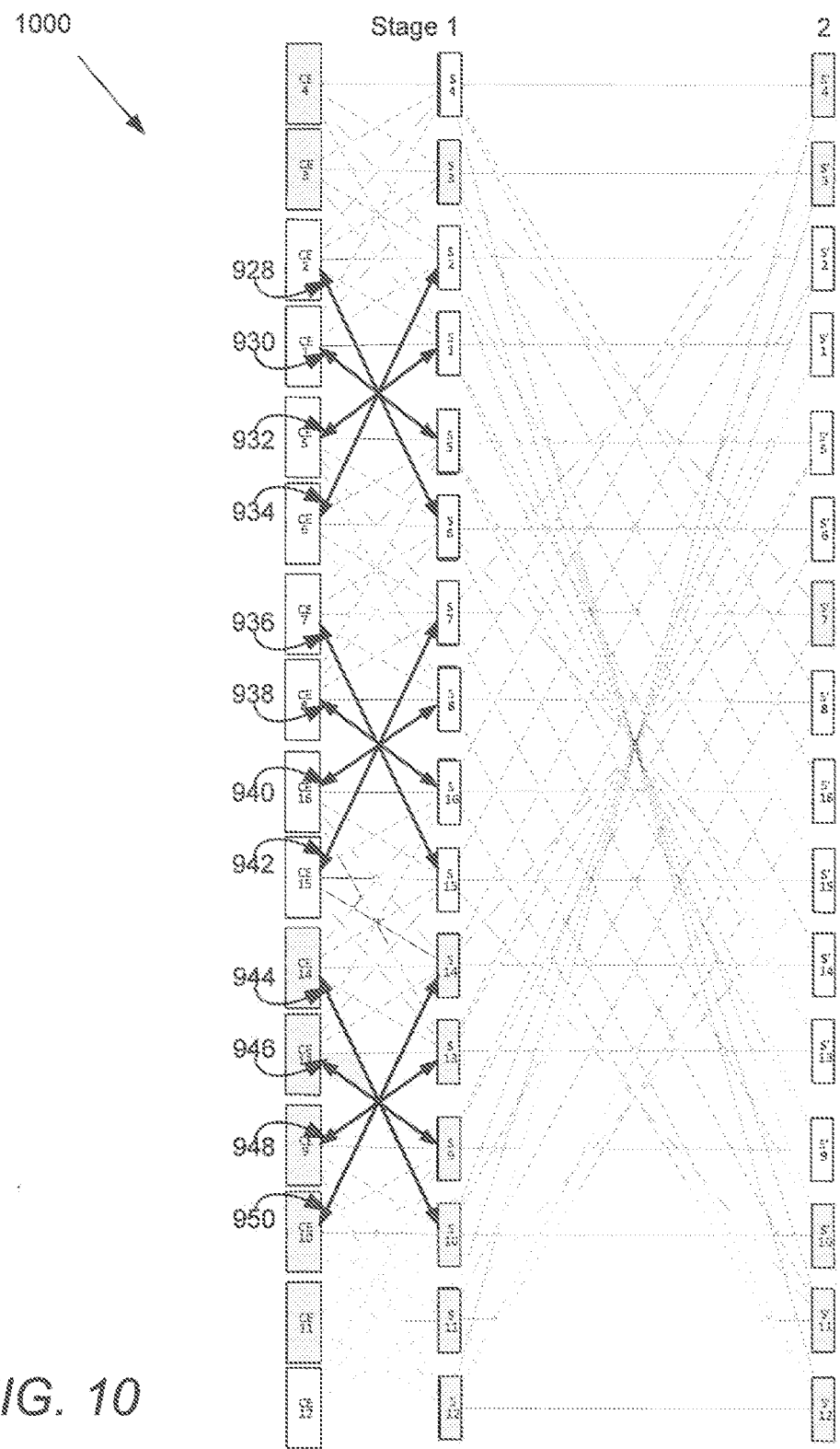
FIG. 10 illustrates, in block diagram form, an exemplary boundary-less radix-4 fat-tree network of 16 CEs using radix-5 switches in a first stage, in accordance with an embodiment of the invention.

A boundary-less radix-4 fat-tree network of 16 CEs using radix-5 switches in a first stage in accordance with an embodiment of the invention is illustrated in FIG. 10. In several embodiments, a boundary-less network 1000 can be constructed by identifying wires between a first stage and a second stage having an interconnect distance of 1, 2, or 3. In many embodiments, the identified wires can be moved below the first stage to transform the first stage to a boundary-less network. Following the radix-2 methodology as discussed above, the example cross-routes 928, 930, 932, 934, 936, 938, 940, 942, 944, 946, 948, and 950 can be moved from downstream and reconnected between the CEs and the stage 1 switches resulting in a boundary-less radix-4 fat-tree network as shown in FIG. 10.

Macro-Based Design Implementation

A macro-based design methodology can be adopted for various implementations of the invention. By dividing a large FPGA into smaller, identical macros, a FPGA can be constructed more readily. However, optimized interconnect architectures typically result in macros of various sizes and shapes. In many embodiments, a heterogeneous macro-based design can be utilized for implementation.

Figure 11A:
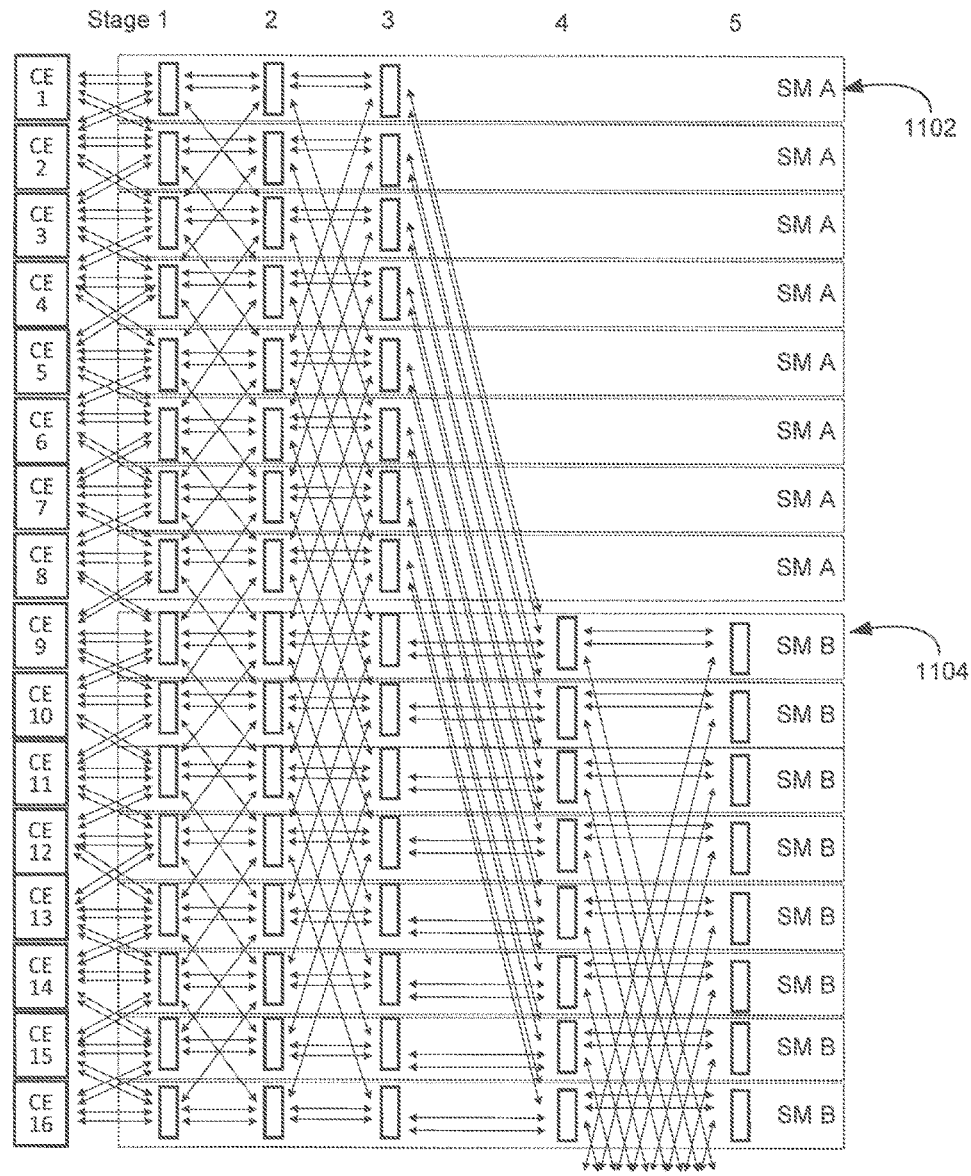
FIGS. 11A-B illustrate, in block diagram form, an exemplary heterogeneous macro-based design using switch matrix macros, in accordance with an embodiment of the invention.

A heterogeneous macro-based design in accordance with an embodiment of the invention is illustrated in FIG. 11A. In many embodiments, each "row" of switch matrices can be grouped together as one large switch matrix (SM) macro, in which case two types of larger SM macros, such as SM A 1102 and SM B 1104 can be constructed.

Figure 11B:
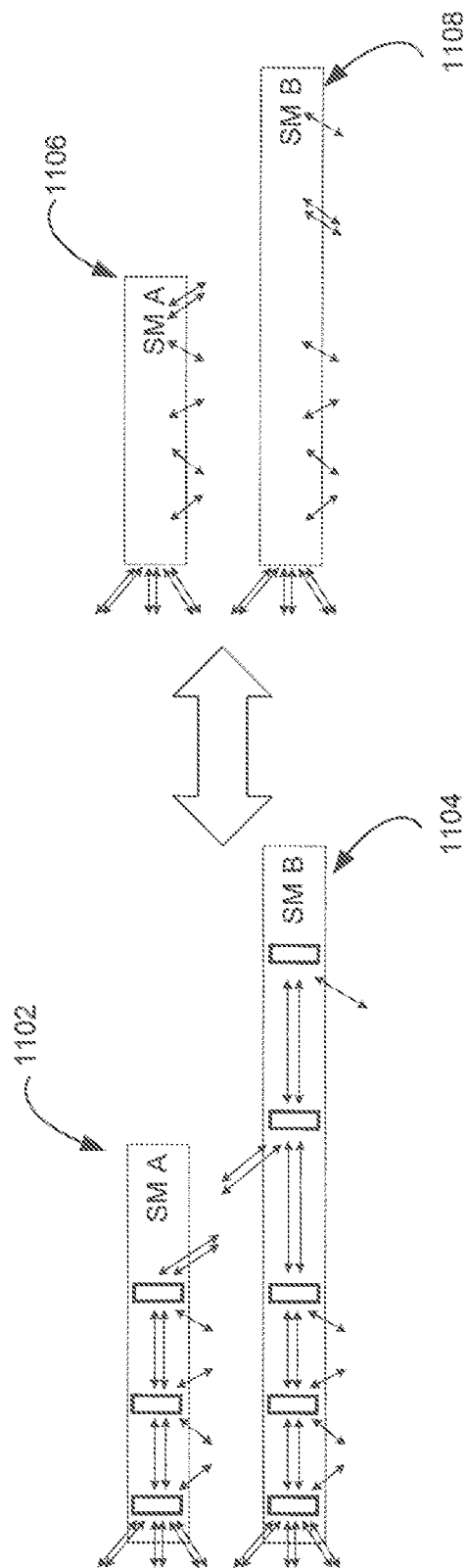

SM macros for use in heterogeneous macro-based design in accordance with an embodiment of the invention is illustrated in FIG. 11B. In many embodiments, large SM macro structures (1102 and 1104) can be abstracted to remove the internal wiring (1106 and 1108) of the macro for simplification of drawing. In several embodiments, the input/output wires can be shown for the macro.

Although specific techniques for macro-based design implementation are discussed above with respect to FIGS. 11A-B, any of a variety of techniques for macro-based design implementation as appropriate to the requirements of a specific application can be utilized in accordance with embodiments of the invention.

FPGA Design with Heterogeneous Interconnect and Computing Elements

FPGAs can be composed of heterogeneous interconnects and CEs. With a macro-based design, a plurality of SM macros can be utilized to interconnect a variety of CEs.

Figure 12A:
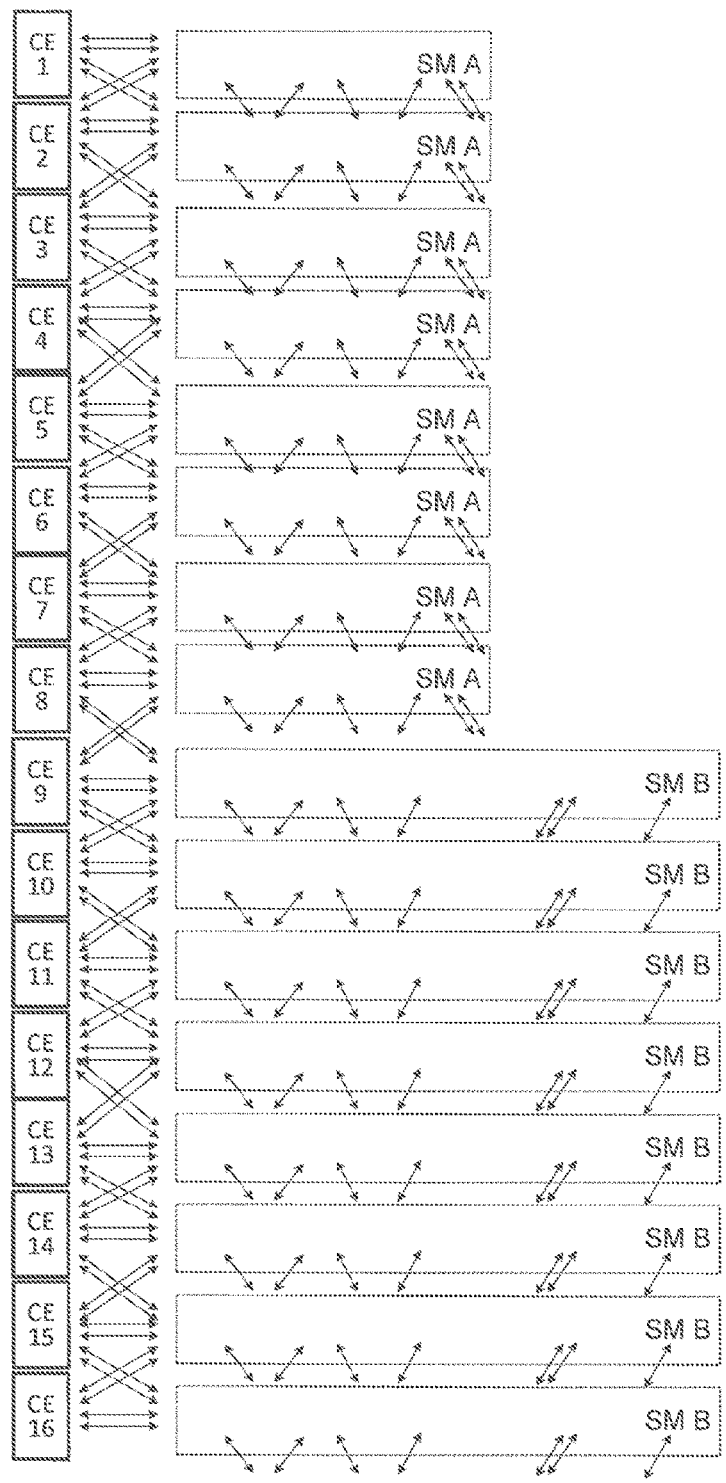
FIGS. 12A-B illustrate, in block diagram form, an exemplary FPGA design depicting 16 CE connections of switch matrix (SM) macros in accordance with an embodiment of the invention.

A FPGA design depicting 16 CE connections each represented by one SM macro in accordance with an embodiment of the invention is illustrated in FIG. 12A.

Figure 12B:
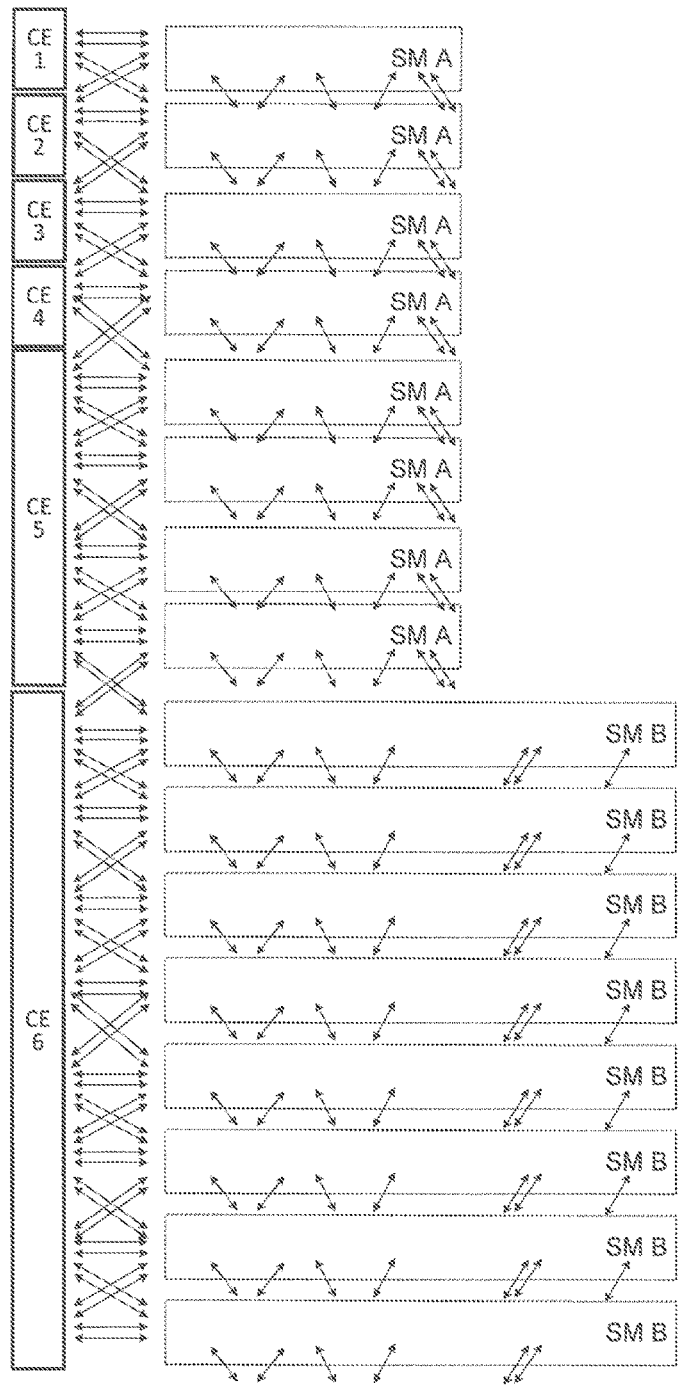

A FPGA design depicting heterogeneous CEs requiring various input/output connections in accordance with an embodiment of the invention is illustrated in FIG. 12B. In many embodiments, the interconnect architecture is agnostic to the internal structure of CEs and thus the FPGA design typically only needs to match the numbers of I/Os from the CE to the SM. In several embodiments, the decoupling of CE and SM design can allow for easier integration.

Although specific techniques for FPGA design with heterogeneous interconnect and CEs are discussed above with respect to FIGS. 12A-B, any of a variety of techniques for FPGA design with heterogeneous interconnects and CEs as appropriate to the requirements of a specific application, including systems with an arbitrarily large number of CEs, can be utilized in accordance with embodiments of the invention.

Computing Element Considerations of FPGA Designs

A FPGA can have various types and numbers of CEs. In many embodiments, the FPGA design can have four main types of CEs: a high-density reconfigurable logic block (Slice L); a high-density reconfigurable logic block with shift registers and distributed memory (Slice M); a high-performance digital signal processor (DSP) for multiplication and other digital signal operations (Slice-DSP); and a Block Memory, that contains one or more ports for read and write access, and may or may not be reconfigurable (Slice BRAM).

Figure 13A:
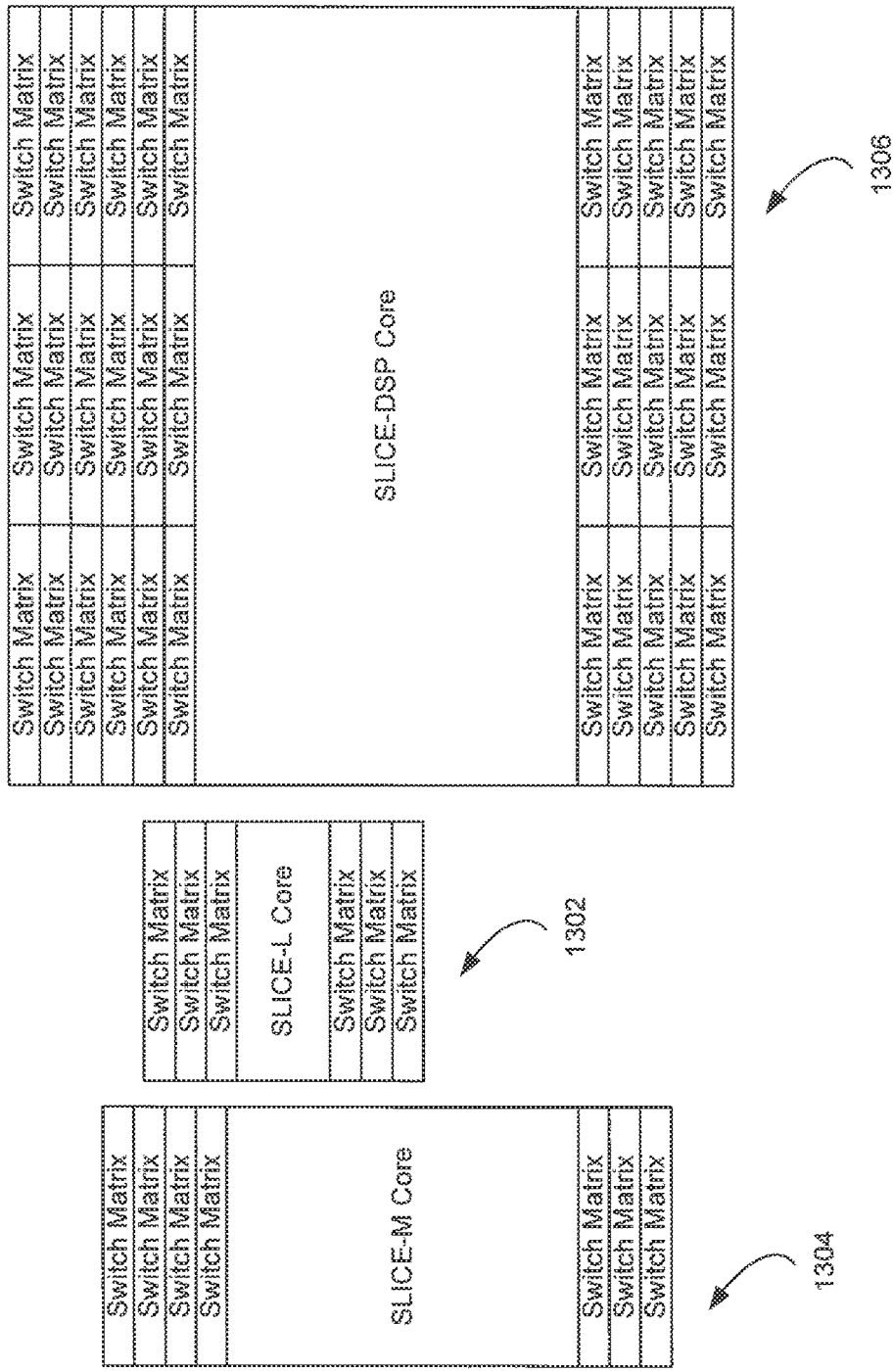
FIGS. 13A-B illustrate, in block diagram form, an exemplary FPGA design with 3 main types of CE elements in accordance with an embodiment of the invention.

A FPGA design where SM macros are integrated with the CE to form a larger macro in accordance with an embodiment of the invention is illustrated in FIG. 13A. In various embodiments, due to the number of I/Os, a Slice L 1302 uses 6 SM macros, while a Slice M 1304 uses 7 SM macros. The Slice DSP can be large with a large number of I/Os and in many embodiments the Slice DSP 1306 is implemented using 33 SM macros as a 11×3 SM array, split above and below the Slice DSP core.

Figure 13B:
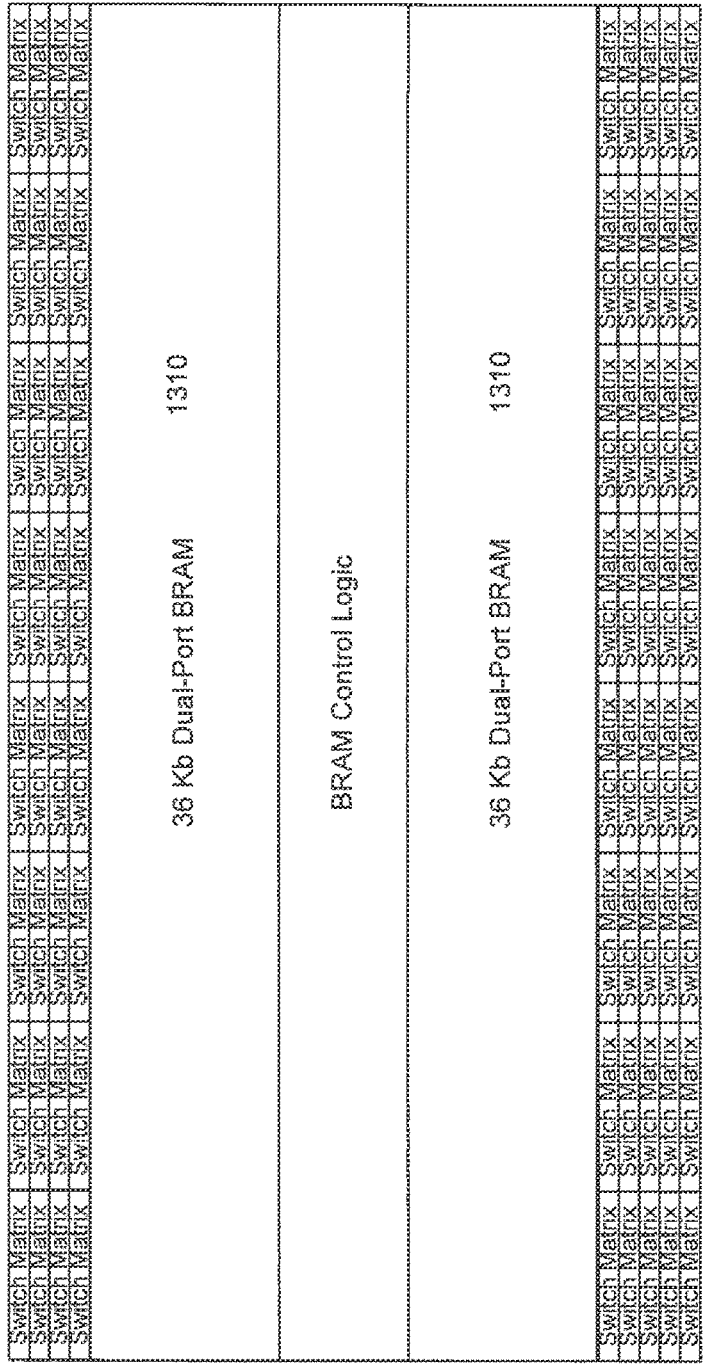

A FPGA design of a Slice BRAM in accordance with an embodiment of the invention is illustrated in FIG. 13B. In several embodiments, each SM macro can be manually designed. In many embodiments, a Slice BRAM 1308 can use 36 SM macros as a 9×4 array. In various embodiments, the 36 Kb BRAM can have a width of approximately 8 SM macros and the BRAMs can be integrated as dual-BRAM macros 1310 using 2BRAM IPs and 72 SMs as a 9×8 array.

Although specific techniques for FPGA design in consideration of CEs are discussed above with respect to FIGS. 13A-B, any of a variety of techniques for FPGA design as appropriate to the requirements of a specific application can be utilized in accordance with embodiments of the invention. Further, similar techniques can be utilized in interconnect architectures with an arbitrarily large number of CEs, in accordance with embodiments of the invention.

Implementing FPGA Designs Using Hierarchical Design Flow

Figure 14:
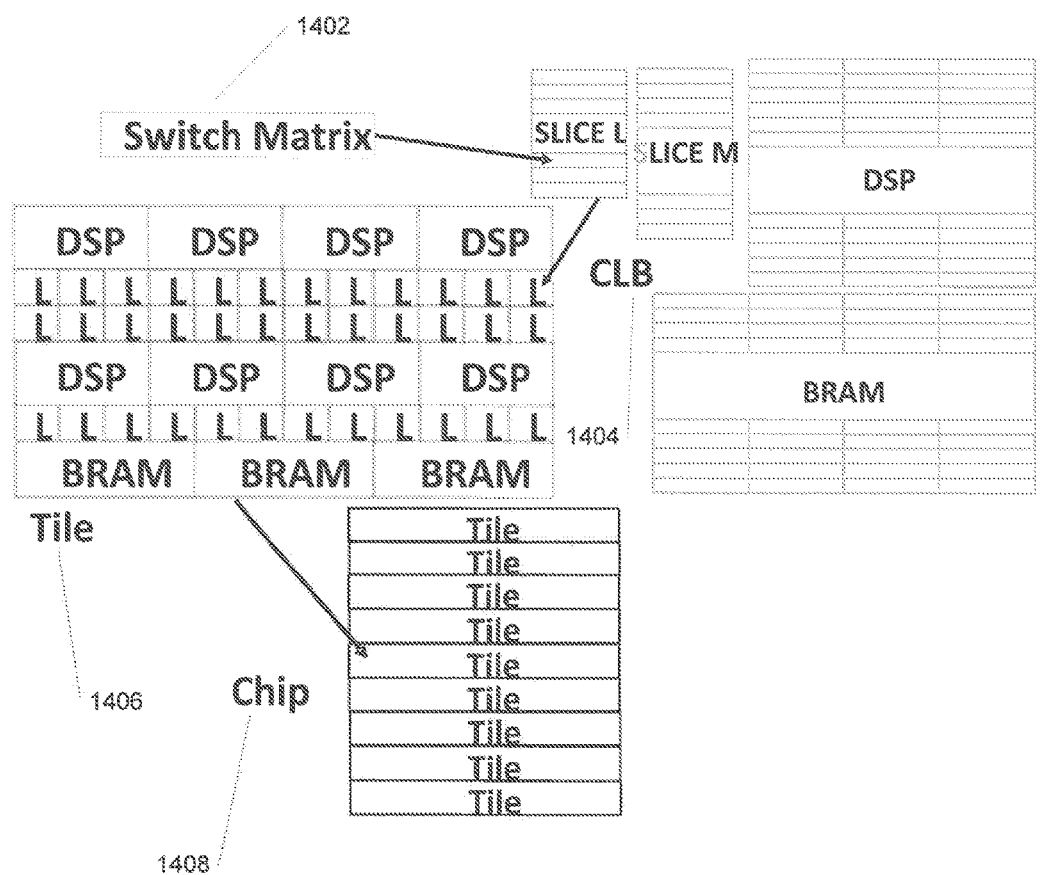
FIG. 14 illustrates an exemplary physical design flow divided into 4 hierarchies in accordance with an embodiment of the invention.

Design flows are useful in implementing a design of an integrated circuit. A physical design flow in accordance with an embodiment of the invention is illustrated in FIG. 14. In many embodiments, the physical design flow can be divided into 4 hierarchies. In the first hierarchy 1402, SM macros can manually be designed. In the second hierarchy, the SM macros can be integrated with CE into one large macro 1404, which can be referred to as a Configurable Logic Block (CLB). In the third hierarchy, heterogeneous CLBs can be integrated into a tile 1406. In the fourth hierarchy, 9 titles can be integrated into a top-level chip 1408.

Although specific techniques for implementing FPGA designs using hierarchical design flows are discussed above with respect to FIG. 14, any of a variety of techniques for implementing FPGA designs as appropriate to the requirements of a specific application can be utilized in accordance with embodiments of the invention.

Top-Level Interconnect Architecture in FPGA Design

Figure 15A:
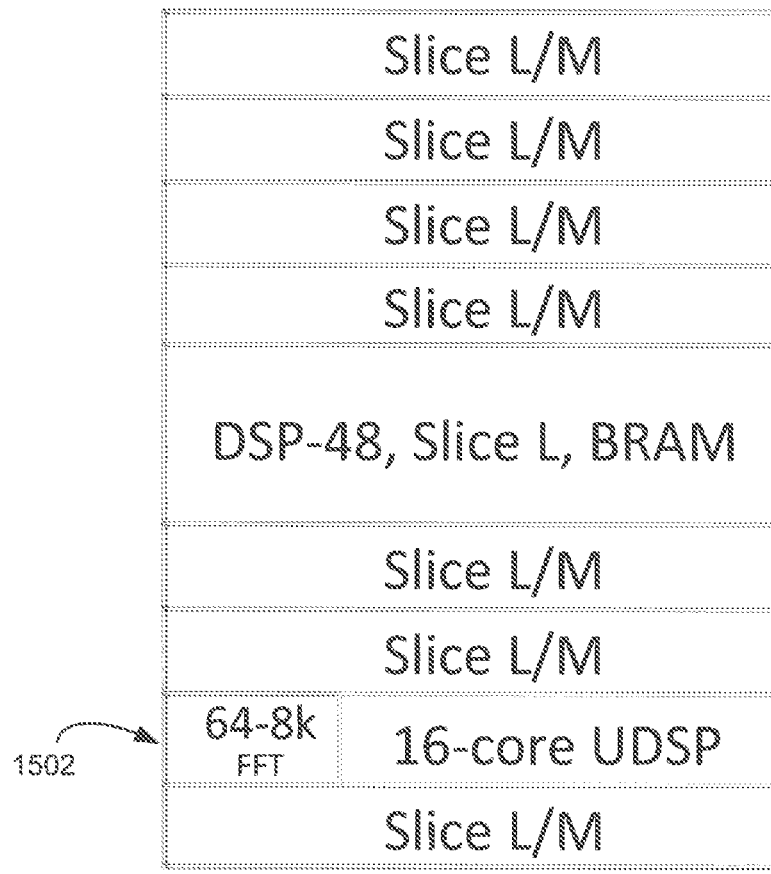
FIGS. 15A-B illustrate an exemplary FPGA design with top-level CE view and SM view in accordance with an embodiment of the invention.

A FPGA typically is an integration of heterogeneous CEs with heterogeneous SM macros. A top-level CE view of a FPGA design in accordance with an embodiment of the invention is illustrated in FIG. 15A. In many embodiments, a chip 1500 can be divided into 9 rectangular tiles, where 8 tiles can contain a combination of Slice L, M, DSP, and BRAM and one tile can contain specific CEs 1502 (depicted here as 64-8 k FFT and 16-core UDSP).

Figure 15B:
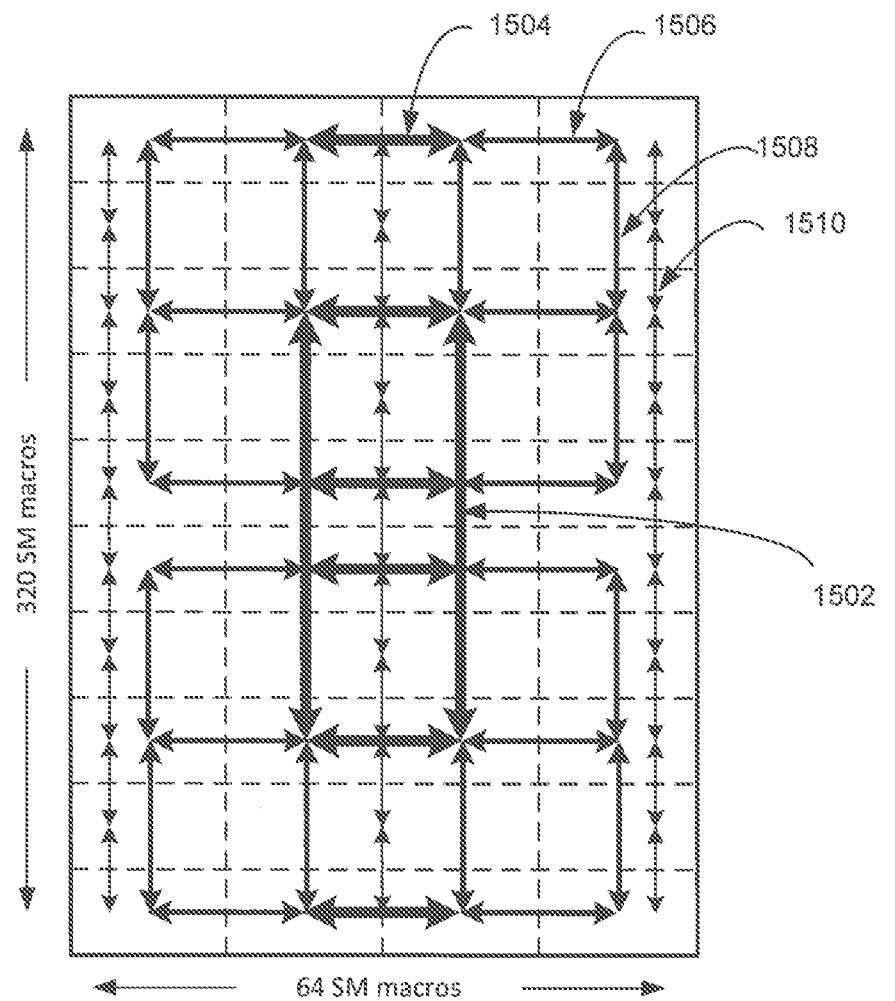
Figure 15B:
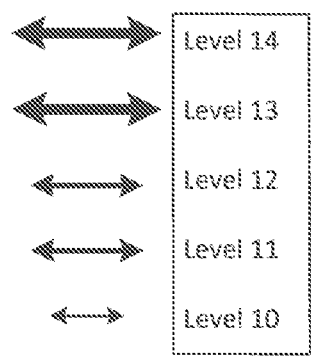

A top-level SM view of a FPGA design in accordance with an embodiment of the invention is illustrated in FIG. 15B. Here, only the top 5 (out of 14) interconnect hierarchies are depicted for simplicity purposes: level 14 1502, level 13 1504, level 12 1506, level 11 1508, and level 10 1510.

Figure 16A:
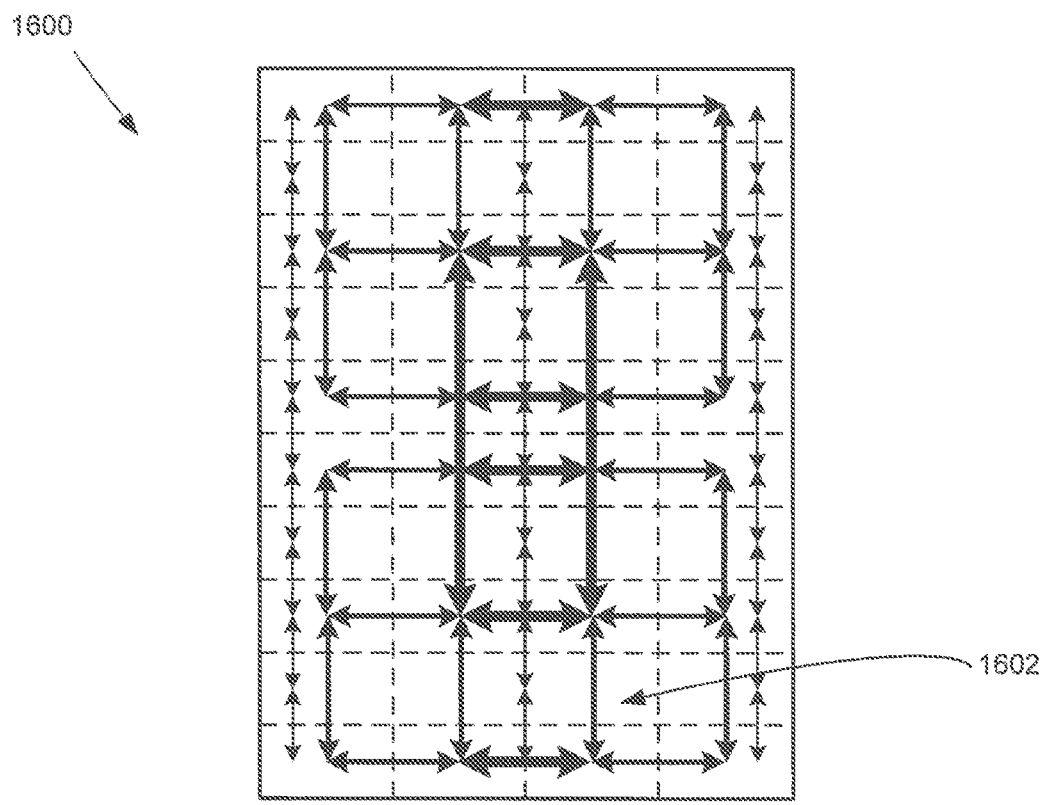
FIGS. 16A-C illustrate an exemplary top-level interconnect architecture of a FPGA design in accordance with an embodiment of the invention.
Figure 16B:
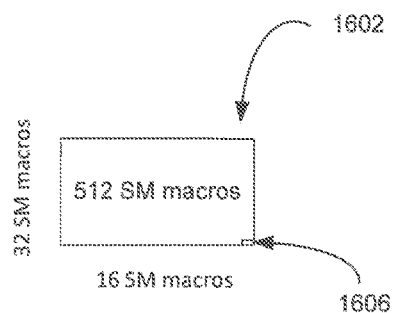
Figure 16C:
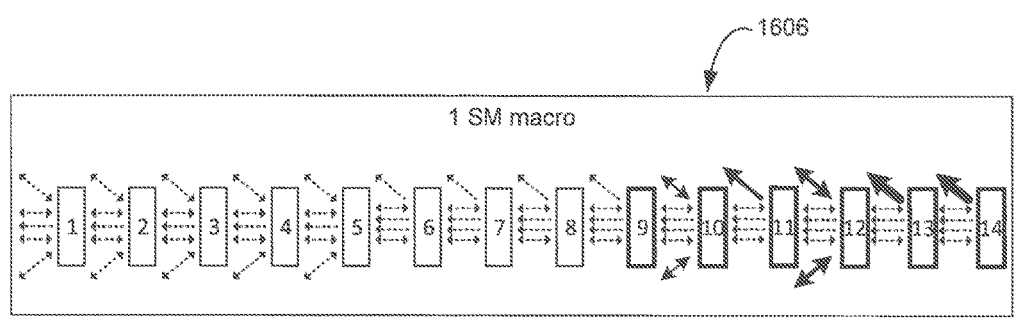

A top-level interconnect architecture of a FPGA design in accordance with an embodiment of the invention is illustrated in FIGS. 16A-C. In many embodiments, as shown in FIG. 16A, the top-level interconnect architecture 1600 can include 20480 SM macros 1600, divided into 7 heterogeneous designs and further separated (as illustrated by each box 1602). As illustrated in FIG. 16B, the heterogeneous design 1602 can include 512 smaller SM macros 1606, where each SM macro can further include various CEs. An example of one possible SM macro is illustrated 1606, in FIG. 16C.

Although specific techniques for using top-level interconnect architectures in FPGA design are discussed above with respect to FIGS. 15A-B and 16, any of a variety of techniques for using top-level interconnect architectures in FPGA design as appropriate to the requirements of a specific application can be utilized in accordance with embodiments of the invention.

Properties of Boundary-Less Hierarchical Networks

Boundary-less hierarchical networks can include a plurality of CEs having M outputs and N inputs, where each CE can communicate with other CEs using switches arranged in stages upon transformations as further discussed above. In many embodiments, boundary-less hierarchical networks can be arrived at in many different ways. Further, although CEs are discussed above in their conventional sense (as a singular elements), in various embodiments, the CEs themselves can be boundary-less networks.

Figure 17A:
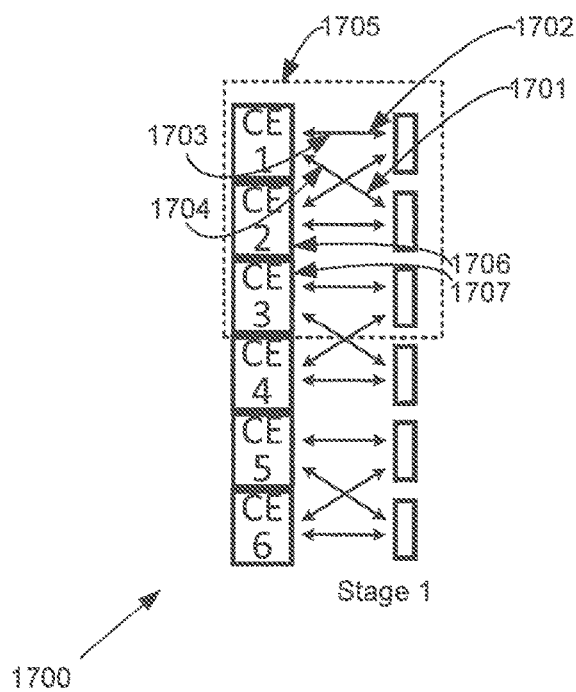
FIGS. 17A-D illustrate portions of untransformed networks.
Figure 17B:
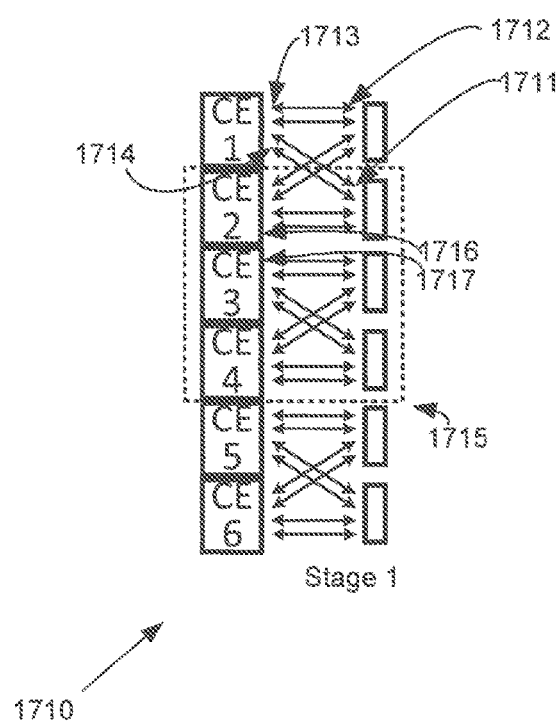
Figure 17C:
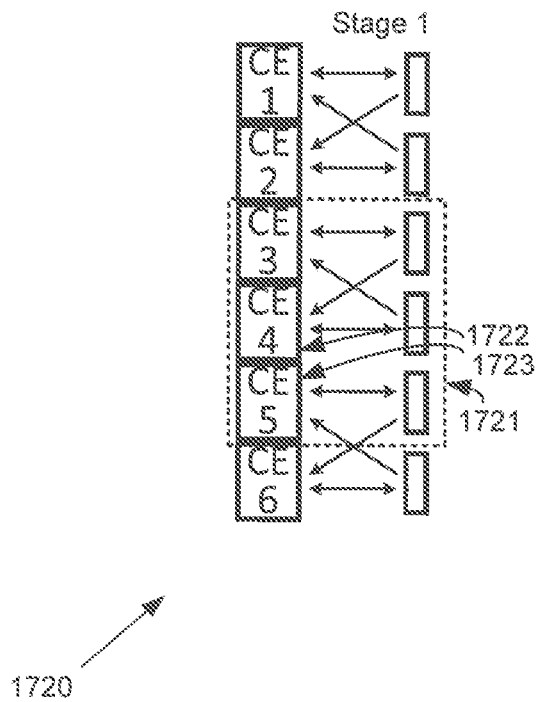
Figure 17D:
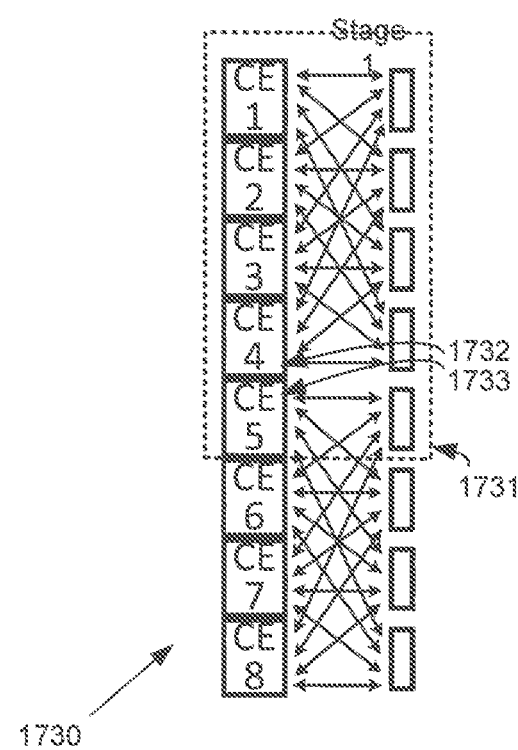
Figure 18A:
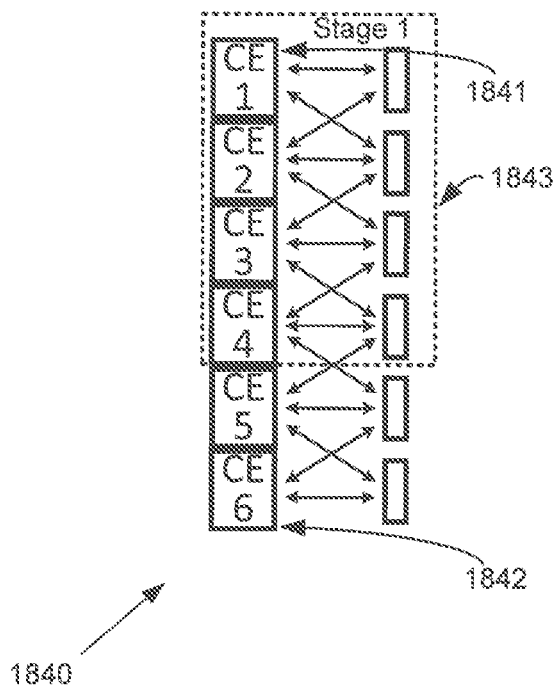
FIGS. 18A-D illustrate, in block diagram form, exemplary boundary-less hierarchical networks (after transformation using, for example, the techniques described herein) in accordance with one or more embodiments.
Figure 18B:
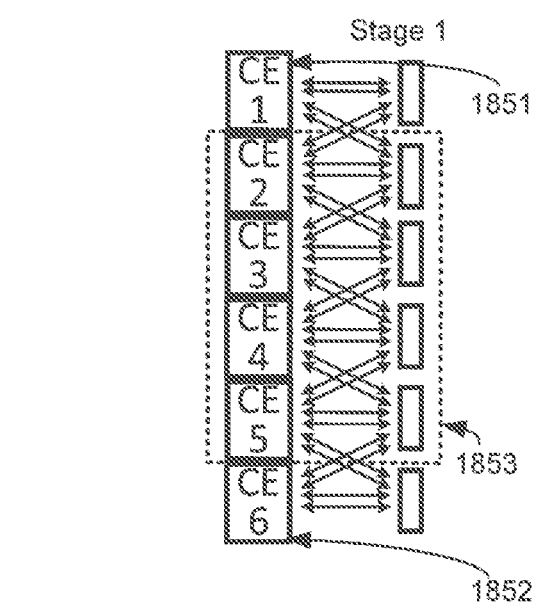
Figure 18C:
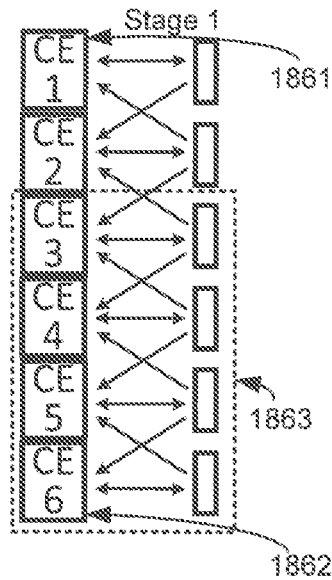
Figure 18D:
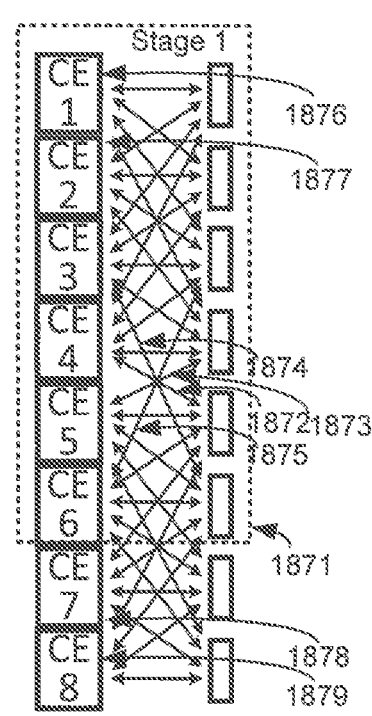

Untransformed networks in accordance with embodiments of the invention are illustrated in FIGS. 17A-C. In FIG. 17A, the network 1700 includes 6 CEs utilizing bi-directional wires to transfer data using a set of stage 1 switches (unidirectional wires can also be utilized as an alternative). In many embodiments, CEs and switches can have M output and N inputs. For example, in network 1700 each CE has 2 outputs (M=2) (for CE 1 identified as 1701, 1702) transmitting data upstream, (where each stage one switch has 2 inputs receiving the transmitted data from a CE). Similarly, in network 1700 each CE has 2 inputs (N=2) (for CE 1 identified as 1703 and 1704) coming downstream receiving data from a stage 1 switch. Further, each CE of the network 1700 can be described as having a particular number of routes (W) per branch where the number of routes per branch does not affect the definition of outputs or inputs. An example of a network having 2 routes (W=2) per branch in accordance with an embodiment of the invention is illustrated in FIG. 17B. The network 1710 can be constructed such that each branch (1711, 1712, 1713, and 1714) has two routes (i.e. double wires). In many embodiments, each branch can have different values of W. Although the number of routes is now 2, each CE of 1701 still has 2 outputs (M=2) and 2 inputs (N=2). An example of a network having 1 routes (W=1) per branch, but only 1 output branch (M=1) and 2 input branch (N=2) in accordance with an embodiment of the invention is illustrated in FIG. 17C, as network 1720. An example of a network having 1 routes (W=1) per branch, but 4 output branch (M=4) and 4 input branch (N=4) in accordance with an embodiment of the invention is illustrated in FIG. 17D, as network 1730.

In several embodiments, a box can be defined having a size of M+1 CEs (and M+1 corresponding switches). In untransformed networks, any box of size M+1, includes at least two nearest neighboring CEs (CEs that directly adjacent) that cannot directly communicate with each other using a stage 1 switch. For example, in the 1700 network, the box 1705 can be drawn to include CE 1. CE 2, and CE 3 where CE 2 1706 and CE 3 1707 cannot directly communicate with each other using a stage 1 switch. Similarly, in network 1710, a box 1715 includes CEs 2, 3, and 4 where CE 2 1716 cannot directly communicate with CE 3 1717 using a stage 1 switch. A further example includes network 1720 where the box 1721 includes CE 3, 4, and 5 where CE 4 1722 cannot directly communicate CE 5 1723 using a stage 1 switch. Furthermore, network 1730 can define a box 1731 that includes CEs 1, 2, 3, 4, and 5 where CE 4 1732 and CE 5 1733 cannot directly communicate with each other using a stage 1 switch.

In contrast, in boundary-less networks utilizing transformation methods as described above, a box can be defined where each CE of the box can communicate with a nearest neighboring CE via a stage one switch. Boundary-less networks in accordance with embodiments of the invention are illustrated in FIGS. 18A-D. In many embodiments, various CEs can have additional input and/or outputs due to one or more transformations. Other CEs, particularly those near edges of networks such as 1841 and 1842 (in network 1840), 1851 and 1852 (in network 1850), 1861 and 1862 (in network 1860), 1876, 1877, 1878, and 1879 (in network 1870) typically maintain the same number of inputs and outputs (i.e. no branches are added). As stated above, transformed networks allow for defining boxes where all CEs of the box can communicate with any nearest neighboring CE via a stage one switch. For example, in network 1840, the box 1843 includes CE 1, 2, 3, and 4 where each CE can directly communicate with a nearest neighboring CE via a stage 1 switch. Similarly, in network 1850, the box 1853 includes CE 2, 3, 4, and 5, where each CE can directly communicate with a nearest neighboring CE via a stage 1 switch. Likewise, in network 1860, the box 1863 can be defined to include CEs 3, 4, 5, and 6 where each CE can directly communicate with a nearest neighboring CE via a stage 1 switch. Again, in network 1870, the box 1871 can be defined to include CEs 1, 2, 3, 4, 5, and 6, where each CE can communicate with a nearest neighboring CE via a stage 1 switch.

Further, in networks where the inputs and/or outputs are greater than 3 (such as in network 1870) some nets (1872, 1873) are essential, thereby converting CE 4 and CE 5 to having inputs of 5, but some nets, such as 1874 and 1875 can be optional, allowing CE 3 and CE 6 the option of converting to inputs and outputs of 5.

Figure 19A:
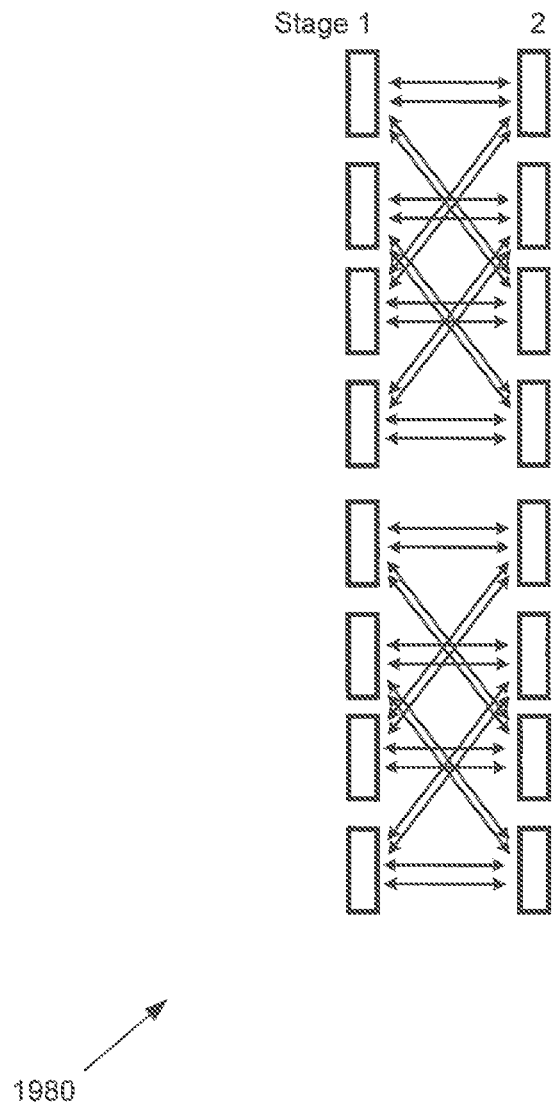
FIGS. 19A-B illustrate, in block diagram form, exemplary boundary-less hierarchical networks (after transformation using, for example, the techniques described herein) in accordance with one or more embodiments.
Figure 19B:
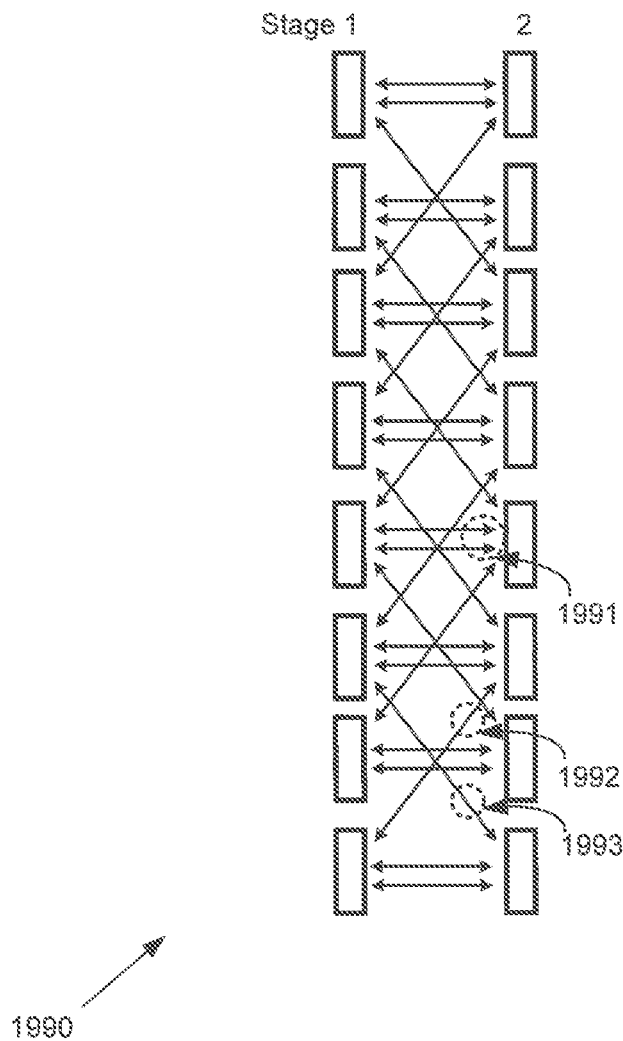

In many embodiments, the same network can apply to all other hierarchical stages. FIGS. 19A-B shows a portion of a hierarchical network between stage 1 and stage 2. The traditional, untransformed network is shown on the left, labeled as 1980, each stage one switch has an output of 2 (M=2) and input of 2 (N=2) using double wires (W=2). The transformed network is shown on the right, labeled as 1990. In this illustration, the local routing directly connecting stage 1 and stage 2 switches within the same SM macro, such as those labeled as 1991, have double wires (W=2), while those that branch out to connect to stage 2 switches outside the same SM macro, such as those labeled as 1992 and 1993, have single wires (W=1). This approach can increase the radix R (where R is the greater of N or M; R is now increased from 2 to 3 in this example) of the switches without increasing wire count. Although specific properties of boundary-less hierarchical networks are discussed above with respect to FIGS. 17-19B, any of a variety of properties of boundary-less hierarchical networks can be identified as appropriate to the requirements of a specific application in accordance with embodiments of the invention.

Further, the switches and multiplexers employed to generate and/or instantiate the inventive networks or architectures described and/or illustrated herein may be implemented using any type of switches and multiplexers now known or later developed. For example, in one embodiment, convention-type switches and multiplexers may be employed to implement the inventive networks or architectures. In another embodiment, one or more switches and multiplexers described and illustrated in Provisional Application Ser. No. 61/791,243, entitled Fine-grained Power Gating in FPGA Interconnects, filed on Mar. 15, 2013, which is incorporated in its entirety herein by reference, may be employed. For example, in one embodiment, the inventive networks or architectures described and/or illustrated herein may include one or more of the inventive switches and multiplexers (including the control signals and buffers associated with such switches and multiplexers) described and illustrated in the Provisional Application No. 61/791, 243 ('243 Provisional Application) to form the inventive networks or architectures. Notably, all permutations and combinations of the switches and multiplexers described and illustrated in the '243 Provisional Application may be employed to generate and instantiate the networks or architectures. Thus, the switch and multiplexer blocks illustrated herein may be representative of conventional switches and multiplexers, and/or the inventive switches and multiplexers described and illustrated in the '243 Provisional Application, and/or switches and multiplexers that may not yet be developed; all such combinations are intended to fall within the scope of the present inventions As mentioned above, the techniques described herein may be implemented using one or more processors (suitably programmed) to perform, execute and/or assess one or more of the functions or operations described herein to generate the switch networks or architectures of the present inventions.

Notably, it should be further noted that the various circuits and circuitry disclosed herein may be described using computer aided design tools and expressed (or represented), as data and/or instructions embodied in various computer-readable media, for example, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.). The present inventions are also directed to such representation of the circuitry described herein, and/or techniques implemented thereby, and, as such, are intended to fall within the scope of the present inventions.

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations and simulation instruction-based expressions using computer aided design, simulation and/or testing tools. The simulation of the inventive networks for logic and/or computing circuitry, including the inventive processes or techniques implemented herein and/or by such inventive networks or architectures and logic and/or computing circuitry, may be implemented by a computer system wherein characteristics and operations of such circuitry, and techniques implemented thereby, are simulated, imitated, replicated, analyzed and/or predicted via a computer system. The present inventions are also directed to such simulations and testing of the inventive networks and/or architectures for logic and/or computing circuitry, and/or inventive techniques implemented herein and/or techniques implemented by such networks, logic circuitry and/or computing circuitry, and, as such, are intended to fall within the scope of the present inventions. The computer-readable media and data corresponding to such simulations and/or testing tools are also intended to fall within the scope of the present inventions.

Although the present invention has been described in certain specific aspects, many additional modifications and variations would be apparent to those skilled in the art. It is therefore to be understood that the present invention may be practiced otherwise than specifically described without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

Notably, in the claims, the term "integrated circuit" means an integrated logic and/or computing circuit including (but not limited to) processors, state machines, gate arrays, programmable gate arrays, field programmable gate arrays, and system-on-chips, or any other integrated circuit that may employ one or more of the hierarchical network of the present inventions and/or may be designed/manufactured according to one or more methods of the present inventions.

What is claimed is:

1. A hierarchical network in an integrated circuit, the hierarchical network comprising:
   a plurality of computing elements, where the plurality of computing elements have M outputs and N inputs; and
   a plurality of switches arranged into a plurality of stages of switches wherein:
     the plurality of computing elements are connected to switches in a first stage via routes;
     the switches in the first stage are connected to the plurality of computing elements and switches in a second stage via routes, where the switches in the second stage are connected to the switches in the first stage via routes;
     each of at least M+1 adjacent computing elements is configured to connect to at least two nearest neighboring computing elements via a single switch of the first stage; and
   every computing element is configured to connect with every other computing element within the hierarchical network via the plurality of switches arranged in the plurality of stages to provide communication between computing elements.

2. The hierarchical network for integrated circuits of claim 1, wherein a plurality of computing elements have M outputs and a plurality of computing elements have M+1 outputs and a plurality of switches in the first stage have M inputs and a plurality of switches of the first stage have M+1 inputs.

3. The hierarchical network for integrated circuits of claim 2, wherein at least $2^{M-1}$ computing elements have M outputs and at least $2^{M-1}$ switches of the first stage have M inputs.

4. The hierarchical network for integrated circuits of claim 3, wherein $2^{M-1}$ computing elements have M outputs and the remaining computing elements have M+1 outputs.

5. The hierarchical network for integrated circuits of claim 2, wherein at least $2^{M-1}$ switches of the first stage have M-1 outputs and at least $2^{M-1}$ switches of the second stage have M-1 inputs.

6. The hierarchical network for integrated circuits of claim 5, wherein $2^{M-1}$ switches of the first stage have M−1 outputs and the remaining switches of the first stage have M outputs.

7. The hierarchical network for integrated circuits of claim 2, wherein at least $2^M$ switches of the second stage have M−1 outputs and $2^M$ switches of a third stage have M−1 inputs.

8. The hierarchical network for integrated circuits of claim 7, wherein $2^M$ switches of the second stage have M−1 outputs and the remaining switches of the second stage have M outputs.

9. The hierarchical network for integrated circuits of claim 1, wherein the routes are bi-directional double routes.

10. A hierarchical network in an integrated circuit, the hierarchical network comprising:
a plurality of computing elements, where the plurality of computing elements have M outputs and N inputs; and
a plurality of switches arranged into stages of switches wherein:
the plurality of computing elements are connected to switches in a first stage via routes;
the switches in the first stage are connected to the plurality of computing elements and switches in a second stage via routes, where the switches in the second stage are connected to the switches in the first stage via routes;
a plurality of computing elements have M outputs and a plurality of computing elements have M+1 outputs and a plurality of switches in the first stage have M inputs and a plurality of switches in the first stage have M+1 inputs; and
every computing element is configured to connect with every other computing element within the hierarchical network via the plurality of switches arranged in the plurality of stages to provide communication between computing elements.

11. A method for transmitting data between computing elements of a hierarchical network in an integrated circuit, the method comprising:
transmitting data from a computing element to a switch of a first stage within the hierarchical network, where the hierarchical network includes:
a plurality of computing elements having M outputs and N inputs; and
a plurality of switches arranged into stages of switches wherein:
the plurality of computing elements are connected to switches in the first stage via routes; and
the switches in the first stage are connected to the plurality of computing elements and switches in a second stage via routes, where the switches in the second stage are connected to the switches in the first stage via routes; and
transmitting data from the switch in the first stage to another computing element where each of at least M+1 adjacent computing elements is configured to transmit data to at least two nearest neighboring computing elements via a single switch in the first stage.

12. The method of claim 11, wherein a plurality of computing elements have M outputs and a plurality of computing elements have M+1 outputs and a plurality of switches in the first stage have M inputs and a plurality of switches in the first stage have M+1 inputs.

13. The method of claim 12, wherein at least $2^{M-1}$ computing elements have M outputs and at least $2^{M-1}$ switches in the first stage have M inputs.

14. The method of claim 13, wherein $2^{M-1}$ computing elements have M outputs and the remaining computing elements have M+1 outputs.

15. The method of claim 12, wherein at least $2^{M-1}$ switches in the first stage have M−1 outputs and at least $2^{M-1}$ switches in the second stage have M−1 inputs.

16. The method of claim 15, wherein $2^{M-1}$ switches in the first stage have M−1 outputs and the remaining switches in the first stage have M outputs.

17. The method of claim 12, wherein at least $2^M$ switches in the second stage have M−1 outputs and $2^M$ switches in a third stage have M−1 inputs.

18. The method of claim 17, wherein $2^M$ switches in the second stage have M−1 outputs and the remaining switches in the second stage have M outputs.

19. The method of claim 11, wherein the routes are bi-directional double routes.

20. A hierarchical network in an integrated circuit, the hierarchical network comprising:
a plurality of computing elements, where the plurality of computing elements have M outputs and N inputs; and
a plurality of switches arranged into stages of switches wherein:
the plurality of computing elements are connected to switches in a first stage via routes;
the switches in the first stage are connected to the plurality of computing elements and switches in a second stage via routes, where the switches in the second stage are connected to the switches in the first stage via routes;
$2^{M-1}$ computing elements have M outputs and the remaining computing elements have M+1 outputs, where $2^{M-1}$ switches in the first stage have M inputs and the remaining switches have M+1 inputs;
$2^{M-1}$ switches in the first stage have M−1 outputs and the remaining switches in the first stage have M outputs, where $2^{M-1}$ switches in the second stage have M−1 inputs and the remaining switches in the second stage have M inputs;
$2^M$ switches in the second stage have M−1 outputs and the remaining switches in the second stage have M outputs; and
every computing element can connect with every other computing element within the hierarchical network to provide communication between computing elements via the plurality of switches arranged in the plurality of stages.

21. A field programmable gate array, comprising:
a plurality of computing elements, where the plurality of computing elements have M outputs and N inputs; and
a plurality of switches arranged into stages of switches wherein:
the plurality of computing elements are connected to switches in a first stage via routes;
the switches in the first stage are connected to the plurality of computing elements and switches in a second stage via routes, where the switches in the second stage are connected to the switches in the first stage via routes;
each of at least M+1 adjacent computing elements is configured to connect to at least two nearest neighboring computing elements via a switch of the first stage; and every computing element are configure to connect with every other computing element within the field programmable gate array via the plurality of switches arranged in the plurality of stages to provide communication between computing elements.

\* \* \* \* \*